United States Patent
Xu et al.

(10) Patent No.: US 11,362,769 B2
(45) Date of Patent: Jun. 14, 2022

(54) HYBRID AUTOMATIC REPEAT REQUEST (HARQ) WITH POLAR CODED TRANSMISSIONS

(71) Applicant: QUALCOMM Incorporated, San Diego, CA (US)

(72) Inventors: Changlong Xu, Beijing (CN); Jian Li, Beijing (CN); Jilei Hou, San Diego, CA (US); Neng Wang, Lund (SE); Chao Wei, Beijing (CN)

(73) Assignee: QUALCOMM INCORPORATED, San Diego, CA (US)

( * ) Notice: Subject to any disclaimer, the term of this patent is extended or adjusted under 35 U.S.C. 154(b) by 632 days.

(21) Appl. No.: 16/078,341

(22) PCT Filed: Nov. 4, 2016

(86) PCT No.: PCT/CN2016/104582
§ 371 (c)(1),
(2) Date: Aug. 21, 2018

(87) PCT Pub. No.: WO2017/157027
PCT Pub. Date: Sep. 21, 2017

(65) Prior Publication Data
US 2021/0203450 A1    Jul. 1, 2021

(30) Foreign Application Priority Data
Mar. 18, 2016    (WO) ................ PCT/CN2016/076744

(51) Int. Cl.
*H04L 1/18*    (2006.01)
*H03M 13/13*    (2006.01)

(52) U.S. Cl.
CPC .......... *H04L 1/1819* (2013.01); *H03M 13/13* (2013.01); *H04L 1/1816* (2013.01); *H04L 1/1825* (2013.01); *H04L 1/1896* (2013.01)

(58) Field of Classification Search
None
See application file for complete search history.

(56) References Cited

U.S. PATENT DOCUMENTS 7,146,552 B2   12/2006   Kim et al.
8,743,780 B2    6/2014   Sangiamwong et al.
(Continued)

FOREIGN PATENT DOCUMENTS

CN    101053269 A    10/2007
CN    101911561 A    12/2010
(Continued)

OTHER PUBLICATIONS

International Search Report and Written Opinion—PCT/CN2016/076744—ISA/EPO—dated Nov. 30, 2016.
(Continued)

*Primary Examiner* — Saad Khawar
(74) *Attorney, Agent, or Firm* — Loza & Loza, LLP

(57) ABSTRACT

For communication utilizing polar codes, a hybrid automatic repeat request (HARQ) algorithm is provided that takes advantage of the benefits of chase combining HARQ (HARQ-CC) and incremental redundancy HARQ (HARQ-IR), by selecting one or the other in accordance with a code rate of the first transmission. In some examples, the HARQ algorithm utilizes HARQ-IR when the code rate in the first transmission is greater than a code rate threshold, and utilizes HARQ-CC when the code rate in the first transmission is less than the code rate threshold.

21 Claims, 13 Drawing Sheets

(56) References Cited

U.S. PATENT DOCUMENTS

| | | | |
|---|---|---|---|
| 9,071,402 | B2 | 6/2015 | Cheng |
| 2006/0200722 | A1 | 9/2006 | Braun |
| 2010/0272202 | A1* | 10/2010 | Matsumoto ............ H04L 1/1812 375/260 |
| 2012/0044921 | A1 | 2/2012 | Chung et al. |
| 2017/0047947 | A1* | 2/2017 | Hong ................ H03M 13/2906 |

FOREIGN PATENT DOCUMENTS

| | | | |
|---|---|---|---|
| CN | 102158311 | A | 8/2011 |
| CN | 103281166 | A | 9/2013 |
| EP | 2237461 | A1 | 10/2010 |
| EP | 2247019 | A1 | 11/2010 |
| EP | 2273707 | A1 | 1/2011 |
| WO | 0191355 | A1 | 11/2001 |
| WO | 2015100561 | A1 | 7/2015 |
| WO | 2015149225 | A1 | 10/2015 |

OTHER PUBLICATIONS

International Search Report and Written Opinion—PCT/CN2016/104582—ISA/EPO—dated Jan. 24, 2017.

Nokia: "Hybrid ARQ Scheme for HSDPA", 3GPP TSG-RAN HSDPA AdHoc, 3GPP Draft; R1-01-1023 HARQ Scheme, 3rd Generation Partnership Project (3GPP), Mobile Competence Centre; 650, Route Des Lucioles; F-06921 Sophia-Antipolis Cedex; France, vol. RAN WG1, No. Sophia Antipolis, France; Jan. 28, 2002, Jan. 28, 2002 (Jan. 28, 2002), 4 Pages, XP050111055, [retrieved on Jan. 28, 2002] Section 2.1—Some design guidelines for Chase combining and IR; p. 2.

Supplementary European Search Report—EP16894186—Search Authority—The Hague—dated Oct. 18, 2019.

Frenger P., et al., "Performance Comparison of HARQ with Chase Combining and Incremental Redundancy for HSDPA", Proceedings of the IEEE 54th Vehicular Technology Conference, VTC Fall 2001, Jan. 1, 2001, pp. 1829-1833, XP055198954.

* cited by examiner

HYBRID AUTOMATIC REPEAT REQUEST (HARQ) WITH POLAR CODED TRANSMISSIONS

PRIORITY CLAIM

The application claims priority to and the benefit of PCT Application No. PCT/CN/2016/076744 entitled "Hybrid Automatic Repeat Request (HARQ) with Polar Coded Transmissions" filed on Mar. 18, 2016, and PCT Application No. PCT/CN2016/104582 entitled "Hybrid Automatic Repeat Request (HARQ) with Polar Coded Transmissions" filed on Nov. 4, 2016, the entire content of which is incorporated herein by reference as if fully set forth below in its entirety and for all applicable purposes.

TECHNICAL FIELD

The technology discussed below relates generally to wireless communication systems, and more particularly, to hybrid automatic repeat request (HARQ) utilizing polar codes in wireless communication systems.

BACKGROUND

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

However, even with a robust error correcting code, channel conditions may vary such that from time to time a bit error rate may exceed that which may be corrected. In such a case, retransmission of all or part of a packet can further insure error-free communication. Hybrid automatic repeat request (HARQ) is one such retransmission scheme utilized in many existing communication networks. HARQ can act as a fall-back mechanism, providing for retransmissions when error correction schemes fail to correct for bit errors.

While error correcting codes and HARQ algorithms continue to rapidly advance the capabilities and potential of wireless communication systems, additional enhancements are desired, particularly for potential deployment of future wireless communication networks beyond LTE.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for a hybrid automatic repeat request (HARQ) algorithm for wireless communication utilizing polar codes. The algorithm utilizes either incremental redundancy HARQ (HARQ-IR) or chase combining HARQ (HARQ-CC) dependent upon the code rate of the first transmission. It has been observed that HARQ-IR outperforms HARQ-CC at higher code rates of polar coded transmissions, while HARQ-CC actually outperforms HARQ-IR at lower code rates of polar coded transmissions. Accordingly, various aspects of the present disclosure provide an algorithm that selects one of HARQ-CC or HARQ-IR based on the performance of each in accordance with the code rate of the first transmission.

In one aspect, the disclosure provides a method wireless communication utilizing hybrid automatic repeat request (HARQ). The method includes generating a first polar code block utilizing polar coding, transmitting the first polar code block, receiving a negative acknowledgment (NACK) or no response, in response to the first code block. The method further includes generating and transmitting a second polar code block utilizing incremental redundancy HARQ (HARQ-IR) if a code rate of the first polar code block is greater than a code rate threshold. The method further includes generating and transmitting the second polar code block utilizing chase combining HARQ (HARQ-CC) if the code rate of the first polar code block is not greater than the code rate threshold.

Another aspect of the disclosure provides a wireless communication device configured for utilizing hybrid automatic repeat request (HARQ). The wireless communication device includes a transceiver, a memory, and a processor communicatively coupled to the transceiver and the memory. The processor is configured to generate a first polar code block utilizing polar coding, transmit the first polar code block via the transceiver, and receive a negative acknowledgment (NACK) or no response via the transceiver, in response to the first code block. The processor is further configured to generate and transmit a second polar code block utilizing incremental redundancy HARQ (HARQ-IR) if a code rate of the first polar code block is greater than a code rate threshold. The processor is further configured to generate and transmit the second polar code block utilizing chase combining HARQ (HARQ-CC) if the code rate of the first polar code block is not greater than the code rate threshold.

Examples of additional aspects of the disclosure follow. In some aspects of the disclosure, the method further includes dividing an original information block into two sub-blocks and a frozen block, in which each of the two sub-blocks includes information bits and the frozen block includes frozen bits, and polar coding the original information block to produce the first polar coded block. In some aspects of the disclosure, when utilizing HARQ-IR, the method further includes selecting one of the two sub-blocks of the original information block as a selected sub-block for retransmission, generating a retransmitted information block including the selected sub-block and the frozen block, and polar coding the retransmitted information block to produce the second polar code block.

In some aspects of the disclosure, the original information block includes a plurality of original bit locations and the first polar code block includes a plurality of coded bit locations, where each of the plurality of coded bit locations corresponds to one of a plurality of sub-channels over which the first polar code block is transmitted. In some aspects of the disclosure, when utilizing HARQ-IR, the method further includes calculating respective first log likelihood ratios (LLRs) for each of the plurality of coded bit locations, calculating respective second LLRs for each of the plurality of original bit locations from the respective first LLRs, sorting the plurality of sub-channels based on the second LLRs, selecting K best sub-channels in accordance with the second LLRs, setting first original bits of the original information block corresponding to the K best sub-channels as the information bits, setting second original bits of the information block corresponding to N-K sub-channels as the frozen bits comprising the frozen block, and grouping the information bits into the two sub-blocks in accordance with the second LLRs. In some aspects of the disclosure, the method further includes selecting M best sub-channels from the K best sub-channels in accordance with the second LLRs, grouping the information bits corresponding to the M best sub-channels into a first sub-block of the two sub-blocks, and grouping the information bits corresponding to M-K sub-channels into a second sub-block of the two sub-blocks. In some aspects of the disclosure, the method further includes selecting the second sub-block of the two sub-blocks as the selected sub-block.

In some aspects of the disclosure, the method further includes generating and transmitting the second polar code block utilizing one of HARQ-IR or HARQ-CC if the code rate of the first polar code block is equal to the code rate threshold. In some aspects of the disclosure, the second code block is identical to the first code block when HARQ-CC is utilized.

Another aspect of the disclosure provides a method of wireless communication utilizing hybrid automatic repeat request (HARQ). The method includes receiving a first polar code block generated utilizing polar coding, perform decoding of the first polar code block, if decoding of the first polar code block fails, transmitting a negative acknowledgment (NACK), receiving a second polar code block generated utilizing polar coding in response to the NACK, and perform decoding of the second polar code block and the first code block utilizing one of incremental redundancy HARQ (HARQ-IR) or chase combining HARQ (HARQ-CC) based on a code rate of the first polar code block.

Another aspect of the disclosure provides a wireless communication device configured for utilizing hybrid automatic repeat request (HARQ). The wireless communication device includes a transceiver, a memory, and a processor communicatively coupled to the transceiver and the memory. The processor is configured to receive a first polar code block generated utilizing polar coding via the transceiver, perform decoding of the first polar code block, if decoding of the first polar code block fails, transmit a negative acknowledgment (NACK) via the transceiver, receive a second polar code block generated utilizing polar coding in response to the NACK via the transceiver, and perform decoding of the second polar code block and the first code block utilizing one of incremental redundancy HARQ (HARQ-IR) or chase combining HARQ (HARQ-CC) based on a code rate of the first polar code block.

Examples of additional aspects of the disclosure follow. In some aspects of the disclosure, the method further includes receiving the first polar code block generated by polar coding an original information block, in which the original information block includes two sub-blocks and a frozen block, each of the two sub-blocks includes information bits and the frozen block includes frozen bits. In some aspects of the disclosure, the method further includes if the second code block is generated utilizing HARQ-IR, receiving the second polar code block generated by polar coding a retransmitted information block, in which the retransmitted information block includes a selected sub-block of the two sub-blocks and the frozen block. In some aspects of the disclosure, the method further includes, when utilizing HARQ-IR, perform decoding of the second polar code block, setting the information bits corresponding to the selected sub-block as frozen bits in the first polar code block, and perform decoding of the first polar code block.

In some aspects of the disclosure, the method further includes accessing a table including a list of code rates and corresponding HARQ types, where each of the HARQ types is HARQ-IR or HARQ-CC, identifying a selected HARQ type corresponding to the code rate of the first polar code, and perform decoding of the second code block and the first code block utilizing the selected HARQ type. In some aspects of the disclosure, the method further includes comparing the code rate of the first polar code block to a code rate threshold, if the code rate of the first polar code block is greater than the code rate threshold, decoding the second polar code block and the first polar code block utilizing HARQ-IR, and if the code rate of the first polar code block is not greater than the code rate threshold, decoding the second polar code block and the first polar code block utilizing HARQ-CC.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
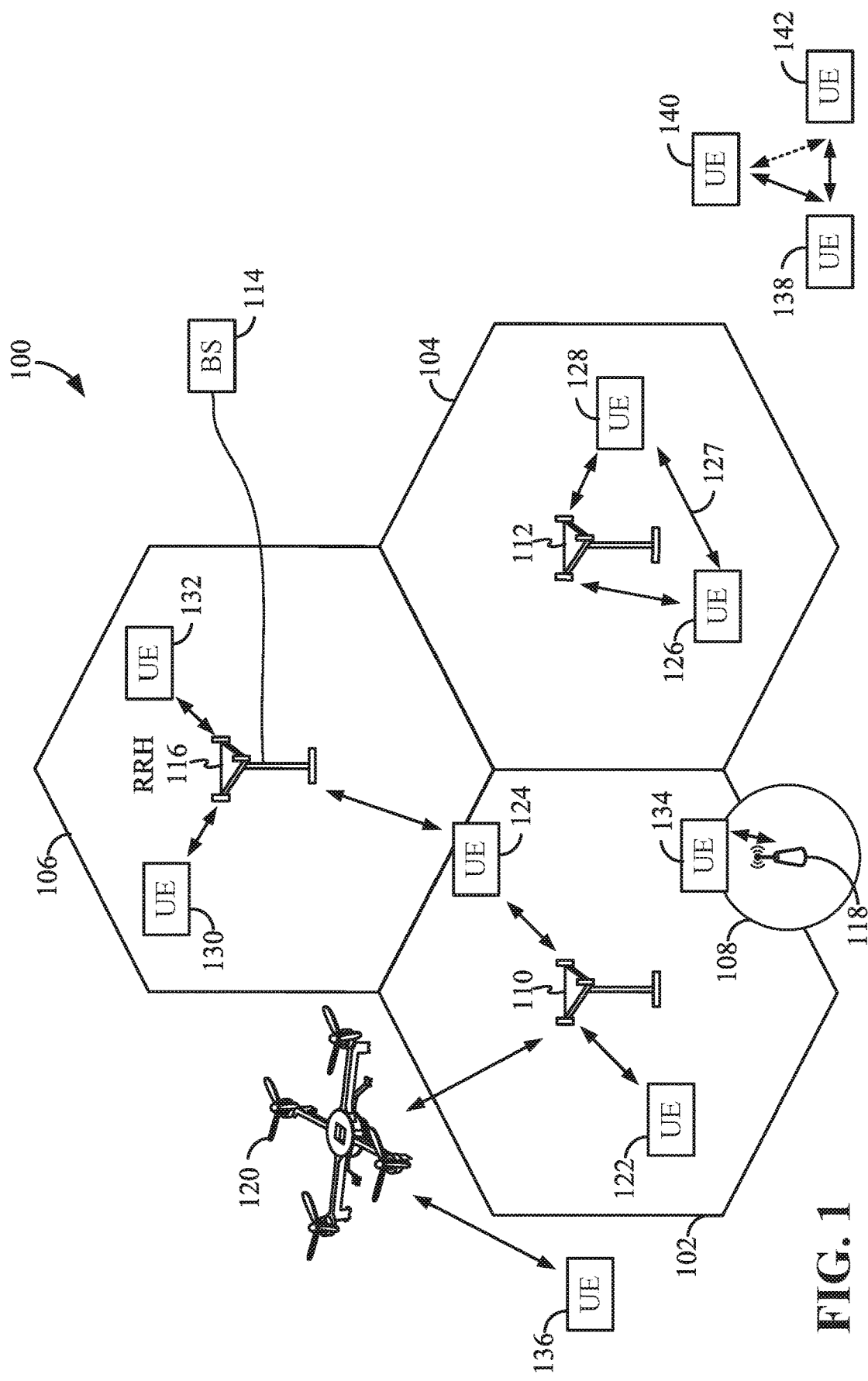
FIG. 1 is a diagram illustrating an example of an access network.

The various concepts presented throughout this disclosure may be implemented across a broad variety of telecommunication systems, network architectures, and communication standards. Referring now to FIG. 1, as an illustrative example without limitation, a simplified schematic illustration of an access network 100 is provided.

The geographic region covered by the access network 100 may be divided into a number of cellular regions (cells), including macrocells 102, 104, and 106, and a small cell 108, each of which may include one or more sectors. Cells may be defined geographically (e.g., by coverage area) and/or may be defined in accordance with a frequency, scrambling code, etc. In a cell that is divided into sectors, the multiple sectors within a cell can be formed by groups of antennas with each antenna responsible for communication with mobile devices in a portion of the cell.

In general, a radio transceiver apparatus serves each cell. A radio transceiver apparatus is commonly referred to as a base station (BS) in many wireless communication systems, but may also be referred to by those skilled in the art as a base transceiver station (BTS), a radio base station, a radio transceiver, a transceiver function, a basic service set (BSS), an extended service set (ESS), an access point (AP), a Node B, an eNode B, or some other suitable terminology.

In FIG. 1, two high-power base stations 110 and 112 are shown in cells 102 and 104; and a third high-power base station 114 is shown controlling a remote radio head (RRH) 116 in cell 106. In this example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the access network 100 may include any number of wireless base stations and cells. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In some examples, the base stations may be interconnected to one another and/or to one or more other base stations or network nodes (not shown) in the access network 100 through various types of backhaul interfaces such as a direct physical connection, a virtual network, or the like using any suitable transport network.

The access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology.

Within the present document, a "mobile" apparatus need not necessarily have a capability to move, and may be stationary. Some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, and a personal digital assistant (PDA). A mobile apparatus may additionally be an "Internet of things" (IoT) device such as an automotive or other transportation vehicle, a satellite radio, a global positioning system (GPS) device, a logistics controller, a drone, a multi-copter, a quad-copter, a consumer and/or wearable device, such as eyewear, a wearable camera, a smart watch, a health or fitness tracker, a digital audio player (e.g., MP3 player), a camera, a game console, etc. An IoT device may additionally be a digital home or smart home device such as a home audio, video, and/or multimedia device, an appliance, a sensor, a vending machine, intelligent lighting, a home security system, a smart meter, etc. A mobile apparatus may additionally be a smart energy or security device, a solar panel or solar array, municipal lighting, water, or other infrastructure; industrial automation and enterprise device, etc. Still further, a mobile apparatus may provide for telemedicine support, or health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with low-power base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or data from a base station (e.g., base station 110) to one or more UEs (e.g., UEs 122 and 124) may be referred to as downlink (DL) transmission, while transmissions of control information and/or data originating at a UE (e.g., UE 122) may be referred to as uplink (UL) transmissions. In addition, the uplink and/or downlink control information and/or data may be transmitted in transmission time intervals (TTIs). As used herein, the term TTI refers to the period in which a block of data, corresponding to the smallest collection of symbols to be processed at the Media Access Control (MAC) layer and above, is transferred by the physical layer onto the radio interface. In accordance with aspects of the present disclosure, a TTI is equal to the duration of a subframe. Thus, as further used herein, the term subframe refers to an encapsulated set of information sent within a single TTI that is capable of being independently decoded. Multiple subframes may be grouped together to form a single frame. Any suitable number of subframes may occupy a frame. In addition, a subframe may have any suitable duration (e.g., 250 μs, 500 μs, 1 ms, etc.).

The air interface in the access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

In some examples, an access network 100 may utilize DL-based mobility or UL-based mobility to enable mobility and handovers from one cell to another. In a network configured for DL-based mobility, during a call with a scheduling entity, or at any other time, a UE may monitor various parameters of the signal from its serving cell as well as various parameters of neighboring cells. Further, depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals may be utilized by the network to select a serving cell for a UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the access network 100. Each of the cells may measure a strength of the pilot signal, and the access network (e.g., one or more of the base stations 110 and 114/116 and/or a central node within the core network) may determine a serving cell for the UE 124. As the UE 124 moves through the access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
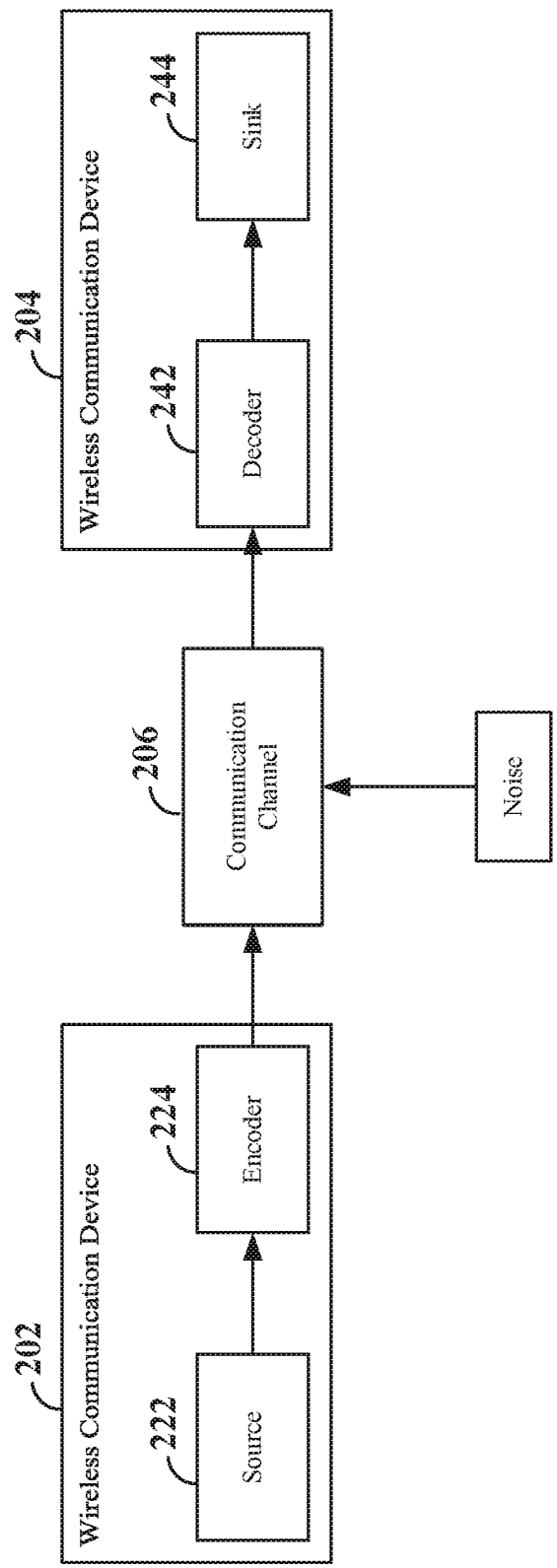
FIG. 2 is a schematic illustration if wireless communication utilizing block codes.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, the first wireless communication device 202 transmits a digital message over a communication channel 206 (e.g., a wireless channel) to the second wireless communication device 204. One issue in such a scheme that must be addressed to provide for reliable communication of the digital message, is to take into account the noise that affects the communication channel 206.

Block codes, or error correcting codes are frequently used to provide reliable transmission of digital messages over such noisy channels. In a typical block code, an information message or sequence is split up into blocks, each block having a length of A bits. An encoder 224 at the first (transmitting) wireless communication device 202 then mathematically adds redundancy to the information message, resulting in a codeword or code block having a length of N, where N>A. Here, the code rate R is the ratio between the message length and the block length: i.e., R=A/N. Exploitation of this redundancy in the encoded information message is a key to reliability of the message, enabling correction for any bit errors that may occur due to the noise. That is, a decoder 242 at the second (receiving) wireless communication device 204 can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to other codes.

Polar codes are linear block error correcting codes invented in 2007 by Erdal Arikan, and currently known to those skilled in the art. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

However, even with the best error correcting codes, if the communication channel 206 experiences a very large amount of noise, or experiences a deep fade or other issue, the bit error rate may exceed what can be compensated. Accordingly, many wireless communication networks utilize a hybrid automatic repeat request (HARQ) scheme to further improve data reliability. In a HARQ algorithm, the transmitting device 202 may retransmit coded information blocks if the first transmission is not decoded correctly at the receiving wireless communication device 204. To facilitate this process, a transmitted code block may include a cyclic redundancy check (CRC) portion, a checksum, or any other suitable mechanism known to those of ordinary skill in the art to determine whether the code block is decoded properly at the receiving device 204. If the received code block is properly decoded, then the receiving device 204 may transmit an acknowledgment (ACK), informing the transmitting device 202 that a retransmission is not needed. However, if the received code block is not properly decoded, then the receiving device 204 may transmit a negative acknowledgment (NACK) requesting a retransmission. In general, a limited number of retransmissions will be made before the transmission attempt is terminated. Many existing networks limit their HARQ algorithms to four retransmissions. However, any suitable retransmission limit may be utilized in a network within the scope of the present disclosure.

Certain aspects of the present disclosure may refer to two particular types or categories of HARQ algorithms: chase-combining HARQ (HARQ-CC) and incremental redundancy HARQ (HARQ-IR). In HARQ-CC, a retransmitted code block is identical to the original transmission of the code block. That is, if a code block is not decoded properly at the receiving device 104, resulting in a NACK, then the transmitting device 202 may retransmit the full code block including identical information to the original transmission. The information may then ideally be obtained error-free by virtue of a process called soft combining, where the redundant bits from the retransmission may be combined to increase the probability of correct reception of each bit.

On the other hand, in HARQ-IR, the retransmitted code block may be different from the originally transmitted code block, and further, if multiple retransmissions are made, each retransmission may differ from one another. Here, retransmissions may include different sets of coded bits: for example, corresponding to different code rates or algorithms; corresponding to different portions of the original information block, some of which may not have been transmitted in the original transmission; corresponding to FEC bits that were not transmitted in the original transmission; or other suitable schemes. As with HARQ-CC, here, the information may be obtained error-free by utilizing soft combining to combine the retransmitted bits with the original transmitted bits.

In accordance with various aspects of the present disclosure, it has been observed that the performance of the HARQ-IR algorithm may exceed that of the HARQ-CC algorithm when the code rate of the first transmission is higher, while the performance of the HARQ-CC algorithm may exceed that of the HARQ-IR algorithm when the code rate of the first transmission is lower. Here, when referring to the performance of one algorithm or the other, in general, it is intended to refer to the block error rate (BLER). That is, a block error may occur when a series of HARQ retransmissions fails to result in a successful decoding of the code block at the receiving device.

Therefore, in an aspect of the disclosure, a wireless communication device may select between the HARQ-CC algorithm and the HARQ-IR algorithm based on the code rate of the first transmission. In some examples, a code rate threshold may be utilized to select between the HARQ-IR and HARQ-CC algorithms. For example, the HARQ-CC algorithm may be utilized when the code rate is less than a code rate threshold, while the HARQ-IR algorithm may be utilized when the code rate is greater than the code rate threshold. The code rate threshold may vary from one implementation to another, and may vary over time. In one example, the code rate threshold may be a fixed value of ½.

In this fashion, a communication system utilizing polar coding may take advantage of the improved performance of the HARQ-IR algorithm when it is available, while also taking advantage of the simplicity of the HARQ-CC algorithm when HARQ-IR would fail to provide improved performance.

Figure 3:
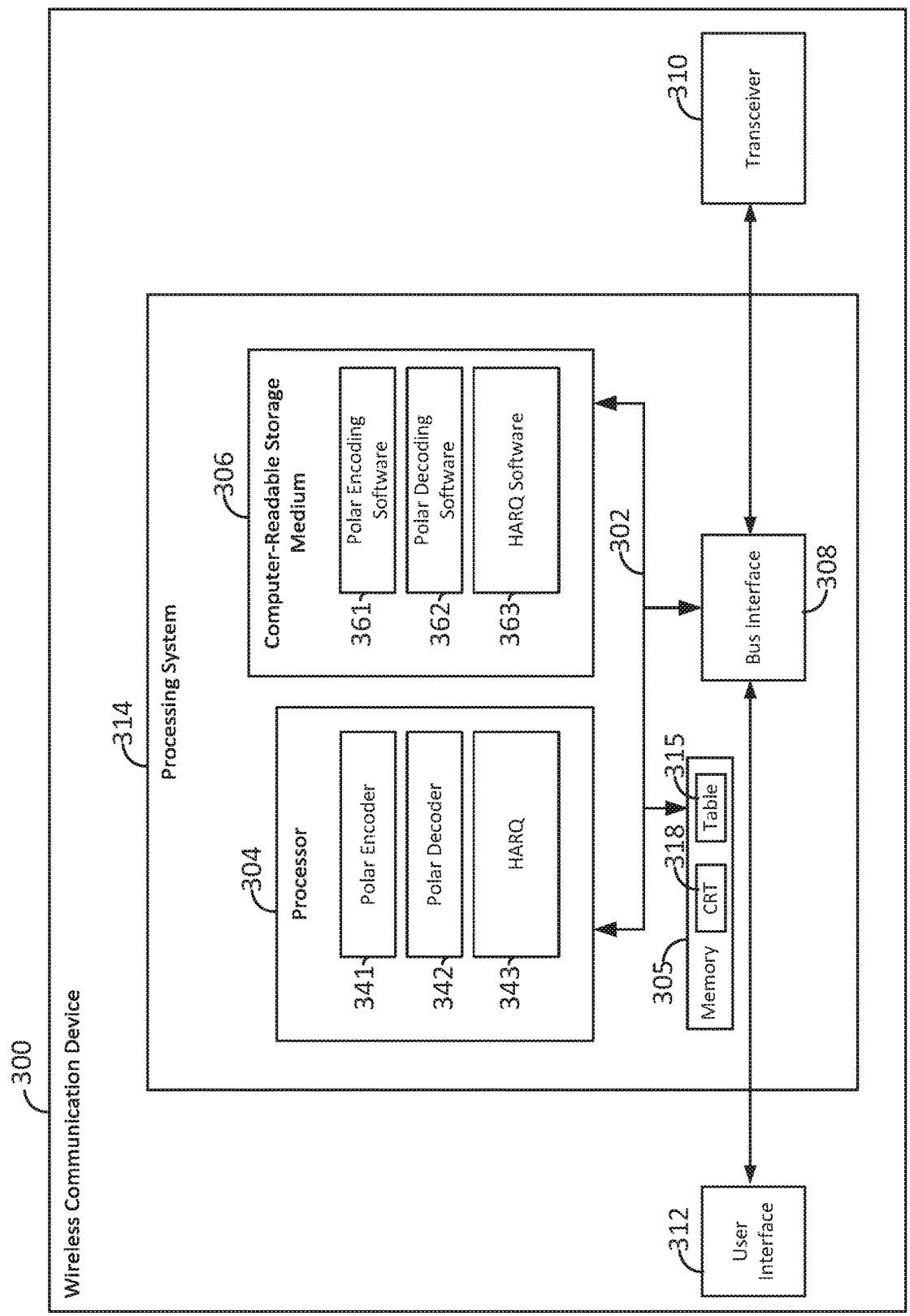
FIG. 3 is a block diagram illustrating an example of a hardware implementation for a wireless communication device employing a processing system according to some embodiments.

FIG. 3 is a block diagram illustrating an example of a hardware implementation for a wireless communication device 300 employing a processing system 314, which may be configured to carry out one or more of the processes and algorithms disclosed herein. That is, in accordance with various aspects of the disclosure, an element, or any portion of an element, or any combination of elements may be implemented with a processing system 314 that includes one or more processors 304. For example, the wireless communication device 300 may be a user equipment (UE), a base station, or any other suitable apparatus or means for wireless communication.

Examples of processors 304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 304, as utilized in a wireless communication device 300, may be used to implement any one or more of the processes described herein.

In this example, the processing system 314 may be implemented with a bus architecture, represented generally by the bus 302. The bus 302 may include any number of interconnecting buses and bridges depending on the specific application of the processing system 314 and the overall design constraints. The bus 302 links together various circuits including one or more processors (represented generally by the processor 304), a memory 305, and computer-readable media (represented generally by the computer-readable storage medium 306). The bus 302 may also link various other circuits such as timing sources, peripherals, voltage regulators, and power management circuits, which are well known in the art, and therefore, will not be described any further. A bus interface 308 provides an interface between the bus 302 and a transceiver 310. The transceiver 310 provides a means for communicating with various other apparatus over a transmission medium. Depending upon the nature of the apparatus, a user interface 312 (e.g., keypad, display, speaker, microphone, joystick) may also be provided.

The processor 304 is responsible for managing the bus 302 and general processing, including the execution of software stored on the computer-readable medium 306. The software, when executed by the processor 304, causes the processing system 314 to perform the various functions described below for any particular apparatus. The computer-readable medium 306 may also be used for storing data that is manipulated by the processor 304 when executing software.

In some aspects of the disclosure, the processor 304 may include circuitry configured for various functions. For example, the processor 304 may include a polar encoder 341, which may in some examples operate in coordination with polar encoding software 341 stored in the computer-readable storage medium 306. The polar encoder 341 may be configured to polar code an original information block to produce a polar code block having a length of N.

For example, the information block may be represented as an information bit vector $u=(u_1, u_2, \ldots, u_N)$. The polar encoder 341 may polar code the information bit vector to produce the polar code block as an encoded bit vector $c=(c_1, c_2, \ldots, c_N)$ using a generating matrix $G_N = B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \ldots & 0 & 0 & 0 & 0 \\ 1 & 0 & 1 & & 0 & 0 & 0 & 0 \\ \vdots & & & \ddots & & & & \vdots \\ 1 & 0 & 0 & & 1 & 0 & 0 & 0 \\ 1 & 1 & 0 & & 1 & 1 & 0 & 0 \\ 1 & 0 & 1 & \cdots & 1 & 0 & 1 & 0 \\ 1 & 1 & 1 & & 1 & 1 & 1 & 1 \end{bmatrix}$$

The polar encoder 341 may then generate the polar code block as:

$$c_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar code block c. In some examples, the information bit vector u may include a number of information bits, denoted K, and a number of frozen bits, denoted $\bar{F}$. Frozen bits are bits that are fixed as 0 or 1. Thus, the value of the frozen bits may generally be known at both the transmitting device and the receiving device. The polar encoder 341 may determine the number of information bits and the number of frozen bits based on the code rate R. For example, the polar encoder 341 may select a code rate R from a set of one or more code rates and select K=N×R bits in the information block to transmit information. The remaining (N-K) bits in the information block may then be fixed as frozen bits $\bar{F}$.

In order to determine which information block bits to set as frozen bits, the polar encoder 341 may further analyze the wireless channel over which the polar code block may be sent. For example, the wireless channel for transmitting the polar code block may be divided into a set of sub-channels, such that each encoded bit in the polar code block is transmitted over one of the sub-channels. Thus, each sub-channel may correspond to a particular coded bit location in the polar code block (e.g., sub-channel-1 may correspond to coded bit location containing coded bit $c_1$). The polar encoder 341 may identify the K best sub-channels for transmitting the information bits and determine the original bit locations in the information block contributing to (or corresponding to) the K best sub-channels. For example, based on the generating matrix, one or more of the original bits of the information block may contribute to each of the coded bits of the polar code block. Thus, based on the generating matrix, the polar encoder 341 may determine K original bit locations in the information block corresponding to the K best sub-channels, designate the K original bit locations in the information block for information bits, and designate the remaining original bit locations in the information block for fixed bits.

In some examples, the polar encoder 341 may determine the K best sub-channels by performing density evolution or Gaussian approximation. Density evolution is generally known to those skilled in the art, and therefore the details thereof are not described herein. For example, construction of polar codes based on density evolution is described in R. Mori and T Tanaka PERFORMANCE OF POLAR CODES WITH THE CONSTRUCTION USING DENSITY EVOLUTION, IEEE Commun. Lett., vol. 13, no. 7, pp. 519-521, July 2009. Gaussian approximation is a lower complexity version of density evolution, and is also generally known to those skilled in the art. For example, construction of polar codes based on Gaussian approximation is described in V. Miloslayskaya, SHORTENED POLAR CODES, IEEE Trans. on Information Theory, June 2015.

In general, the polar encoder 341 may perform density evolution or Gaussian approximation to calculate a respective bit error probability (BEP) and/or log likelihood ratio (LLR) for each of the for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the polar code block, the LLRs of each of the original bit locations may be derived from the known LLRs of the coded bit locations by performing density evolution or Gaussian approximation. Based on the calculated original bit location LLRs, the polar encoder 341 may sort the sub-channels and select the K best sub-channels (e.g., "good" sub-channels) to transmit the information bits.

The polar encoder 341 may then set the original bit locations of the information block corresponding to the K best sub-channels as including information bits and the remaining original bit locations corresponding to the N-K sub-channels (e.g., "bad" sub-channels) as including frozen bits. Bit-reversal permutation may then be performed by applying the bit-reversal permutation matrix $B_N$ described above to the N bits (including K information bits and N-K frozen bits) to produce a bit-reversed information block. The bit-reversal permutation effectively re-orders the bits of the information block. The bit-reversed information block may then be polar coded by the generating matrix $G_N$ to produce a corresponding number (N) of coded bits in the polar code block. The polar encoder 341 may then transmit the polar code block via the transceiver 310.

Further, the processor 304 may include a polar decoder 342, which may in some examples operate in coordination with polar decoding software 352 stored in the computer-readable medium 306. The polar decoder 342 may be configured to receive a polar code block via the transceiver 310 and decode the polar code block to produce the original information block. In some examples, the polar decoder 342 may perform successive cancellation (SC) polar decoding or SC polar list decoding to decode the polar code block.

For example, the polar decoder 342 may be configured to receive a noisy version of c, and to decode c or, equivalently, u, using a simple successive cancellation (SC) decoding algorithm. Successive cancellation decoding algorithms typically have a decoding complexity of O (N log N) and can achieve Shannon capacity when N is very large. However, for short and moderate block lengths, the error rate performance of polar codes significantly degrades.

Therefore, in some examples, the polar decoder 342 may utilize a SC-list decoding algorithm to improve the polar coding error rate performance. With SC-list decoding, instead of only keeping one decoding path (as in simple SC decoders), L decoding paths are maintained, where L>1. At each decoding stage, the polar decoder 342 discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the polar decoder 342 will have a list of L candidates for $u_1^N$, out of which the most likely candidate is selected. Thus, when the polar decoder 342 completes the SC-list decoding algorithm, the polar decoder 342 returns a single information block.

Further, the processor 304 may include a HARQ circuit 343, which may in some examples operate in coordination with HARQ software 353. The HARQ circuit 343 may be configured to determine whether decoding of a polar code block has failed (e.g., by receiving a NACK from the receiving device or receiving an indication from the polar decoder 342), and if so, to perform a HARQ algorithm for retransmission of the polar code block. The HARQ algorithm selects between one of chase combining HARQ (HARQ-CC) and incremental redundancy HARQ (HARQ-IR) based on the code rate of the first transmission of the polar code block. In HARQ-CC, a retransmitted polar code block is identical to the original transmission of the code block. On the other hand, in HARQ-IR, the retransmitted polar code block(s) may be different from the originally transmitted polar code block, and further, if multiple retransmissions are made, each retransmission may differ from one another.

In various aspects of the disclosure, it has been observed that the performance (e.g., BLER performance) of the HARQ-IR algorithm may exceed that of the HARQ-CC algorithm when the code rate of the first transmission is higher, while the performance of the HARQ-CC algorithm may exceed that of the HARQ-IR algorithm when the code rate of the first transmission is lower. Thus, in some examples, the HARQ circuit 343 may utilize a code rate threshold 318 maintained, for example, in memory 305, to select between the HARQ-IR and HARQ-CC algorithms. For example, the HARQ-CC algorithm may be utilized when the code rate is less than a code rate threshold, while the HARQ-IR algorithm may be utilized when the code rate is greater than the code rate threshold.

In some examples, the code rate threshold may be ½. However, in other examples, the code rate threshold may be greater than or less than ½ depending on the code rates supported by the transmitting and receiving devices and the performance (e.g., BLER performance) of the transmitting and receiving devices at the various possible code rates within the wireless communication network. In addition, the code rate threshold may vary from one implementation to another, and may vary over time.

The HARQ circuit 343 may further select between HARQ-CC and HARQ-IR based on not only the code rate of the first transmission of the polar code block, but also the benefits provided by each of the HARQ types. For example, one difference between the two types of HARQ algorithms is that the memory, the decoding latency, and the complexity required to implement a HARQ-CC algorithm are generally less than those utilized to implement a HARQ-IR algorithm. Therefore, according to an aspect of the present disclosure, if the BLER performance of HARQ-IR is no better than HARQ-CC, then the HARQ circuit 343 may be configured to utilize the HARQ-CC algorithm to take advantage of its benefits relating to decoding latency, complexity, and/or reduced memory requirements. In some examples, the BLER performances of HARQ-IR and HARQ-CC are approximately equal at the code rate threshold. Thus, if the code rate of the first transmission is equal to the code rate threshold, the HARQ circuit 343 may be configured to select the HARQ-CC algorithm.

In some examples, the wireless communication device 300 may be a transmitting device, which may in some examples correspond to the transmitting device 202 shown in FIG. 2. In this example, the polar encoder 341 may generate a first polar code block utilizing polar coding and transmit the first polar code block to a receiving device, as described above. In response to the transmission of the first polar code block, the wireless communication device 300 (e.g., HARQ circuit 343) may receive an acknowledgement (ACK) or a negative acknowledgement (NACK) from the receiving device via the transceiver 310, or the HARQ circuit 343 may determine that no response has been received from the receiving device within a predetermined receive window or upon expiry of a receive timer. An ACK may be received, for example, if the first polar code block is properly decoded at the receiving device. A NACK may be received, for example, if the first polar code block is not able to be properly decoded at the receiving device.

In some examples, upon receiving a NACK, or upon determining that no response has been received from the receiving device, the HARQ circuit 343 may compare a code rate of the first polar code block to the code rate threshold 318. Based on the results of the comparison, the HARQ circuit 343 may then select one of the HARQ-CC or the HARQ-IR for use by the polar encoder 341 in generating and transmitting a second polar code block. In some examples, the code rate threshold may be set based on the performance of each of the different types of HARQ (e.g., HARQ-IR and HARQ-CC) at different code rates, as discussed above. For example, the code rate threshold may be set such that HARQ-CC is selected when the code rate of the first polar code block is less than the code rate threshold, while HARQ-IR is selected when the code rate of the first polar code block is greater than the code rate threshold.

Therefore, in an aspect of the disclosure, the HARQ circuit 343 may select the HARQ-CC algorithm when the code rate of the first polar code block is less than the code rate threshold 318. In addition, the HARQ circuit 343 may select the HARQ-IR algorithm when the code rate of the first polar code block is greater than the code rate threshold 318. Furthermore, the HARQ circuit 343 may select either the HARQ-IR algorithm or the HARQ-CC algorithm when the code rate of the first polar code block is equal to the code rate threshold 318. In some examples, the HARQ circuit 343 may select the HARQ-CC algorithm when the code rate of the first polar code block is equal to the code rate threshold and when the performance of HARQ-IR and HARQ-CC at the code rate are substantially equal to take advantage of the benefits relating to decoding latency, complexity, and/or reduced memory requirements offered by HARQ-CC.

If the HARQ circuit 343 selects the HARQ-CC algorithm, the HARQ circuit 343 provides an indication or instruction to the polar encoder 341 that HARQ-CC should be utilized for a HARQ retransmission of the first polar code bock. With HARQ-CC, the polar encoder 341 generates a second polar code block identical to the first polar code block (e.g., the second polar code block includes identical information to the first polar code block) and transmits the second polar code block via the transceiver 310. Thus, with HARQ-CC, the polar encoder essentially retransmits the full first polar code block.

If the HARQ circuit 343 selects the HARQ-IR algorithm, the HARQ circuit 343 provides an indication or instruction to the polar encoder 341 that HARQ-IR should be utilized for a HARQ retransmission of the first polar code block. In some examples, the HARQ-IR retransmission may include a different set of coded bits corresponding to a portion of the original information block utilized to generate the first polar code block For example, the polar encoder 341 may divide the original information block utilized to generate the first polar code block into two sub-blocks and a frozen block, where each of the sub-blocks includes information bits and the frozen block includes frozen bits, as described above. The polar encoder 341 may then select one of the two sub-blocks of the original information block for retransmission and generate the second polar code block utilizing the selected sub-block. For example, the polar encoder 341 may generate a retransmitted information block including the selected sub-block of information bits and a frozen block including frozen bits. Here, the frozen block may include the original frozen block from the original information block and the non-selected sub-block from the original information block. Thus, the information bits in the non-selected sub-block may be frozen (e.g., set to a fixed, known value of 0 or 1). As a result, the number of frozen bits in the retransmitted information block may be equal to the sum of the number of bits in the non-selected sub-block and the number of bits in the original frozen block. The polar encoder 341 may then polar code the retransmitted information block to produce the second polar code block for transmission to the receiving device.

In some examples, the information bits in the original information block may be grouped into the two sub-blocks in accordance with the calculated original bit location LLRs. For example, as described above, the polar encoder 341 may sort the sub-channels based on the original bit location LLRs of the original information block, and select the K best sub-channels (e.g., "good" sub-channels) to transmit the information bits in the original information block. The polar encoder 341 may then set the original bit locations of the information block corresponding to the K best sub-channels as including information bits and the remaining original bit locations corresponding to the N-K sub-channels (e.g., "bad" sub-channels) as including frozen bits in the original information block. The polar encoder 341 may then select the M best sub-channels from the K best sub-channels in accordance with the original bit location LLRs, group the information bits corresponding to the M best sub-channels (e.g., "best" sub-channels) into a first sub-block and the information bits corresponding to the K-M sub-channels (e.g., "worst" sub-channels) into a second sub-block.

The polar encoder 341 may then select one of the first sub-block or the second sub-block for inclusion in the second polar code block. In some examples, the polar encoder 341 may select the second sub-block containing the worst sub-channels for retransmission and populate the bit locations with the highest LLRs in the retransmitted information block with the information bits from the second sub-block to improve the likelihood of the information bits in the second sub-block being properly decoded at the receiver. The polar encoder 341 may then polar code the retransmitted information block to produce the second polar code block.

If the second polar code block is not decoded correctly at the receiver, the polar encoder 341 may repeat this process by sub-dividing the second sub-block into two additional sub-blocks and generating a third polar code block utilizing one of the additional sub-blocks. Although this process has been described using two sub-blocks, in various aspects of the present disclosure, the information bits in the original information block and/or retransmitted information block may be divided into more than two sub-blocks, and one or more of these sub-blocks may be selected for retransmission. In addition, the number of sub-blocks in each information block may vary across retransmissions and/or the number of sub-blocks selected for retransmission may vary across retransmissions.

In some examples, the wireless communication device 300 may be a receiving device, which may in some examples correspond to the receiving device 204 shown in FIG. 2. In this example, the polar decoder 342 may receive the first polar code block generated using polar coding from the transmitting device via the transceiver 310. The polar decoder 342 may then perform decoding of the first polar code block, as described above. If decoding of the first polar code block fails, the polar decoder 342 may inform the HARQ circuit 343, and the HARQ circuit 343 may in turn generate and transmit a NACK to the transmitting device. In response to the NACK, the polar decoder 342 may receive a second polar code block generated using polar coding from the transmitting device via the transceiver 310.

In accordance with various aspects of the disclosure, the polar decoder 343 may then perform polar decoding of the first and second polar code blocks utilizing one of HARQ-IR or HARQ-CC based on whether HARQ-CC or HARQ-IR was used to generate the second polar code block. In some examples, if the second polar code block was generated utilizing HARQ-CC, the polar decoder 343 may perform soft combining of the first and second polar code blocks, in which the redundant bits from the second polar code block are combined with the corresponding bits in the first polar code block to increase the probability of correct reception of each information bit.

In some examples, if the second polar code block was generated utilizing HARQ-IR, the second polar code block may include one or more sub-blocks of information bits from the original information block. For example, as described above, the original information block may be divided into two or more sub-blocks, each including information bits, and a frozen block including frozen bits. The second polar code block may then be generated using a retransmitted information block including one or more selected sub-blocks of the two or more sub-blocks of the original information block and the frozen block, where the number of selected sub-block(s) is less than the total number of sub-blocks of the original information block. As further described above, the frozen block may include the original frozen block from the original information block and the non-selected sub-block(s) from the original information block.

The polar decoder 343 may then perform polar decoding of the first and second polar code blocks by initially attempting to polar decode the second code block. If the second polar code block is successfully decoded, the polar decoder 343 may then set the information bits corresponding to the selected sub-block in the second polar code block as frozen bits in the first code block and decode the first polar code block. If either the first or second polar code block is not successfully decoded, the HARQ circuit 343 may generate and transmit another NACK to the transmitting device to cause the transmitting device to generate and transmit a third polar code block. Upon receiving the third polar code block, the polar decoder 342 may perform polar decoding of the third polar code block, and if successful, set the information bits corresponding to the selected sub-block of the third polar code block as frozen bits in the second polar code block and polar decode the second polar code block. The polar decoder 343 may then set the information bits corresponding to the selected sub-block in the second polar code block as frozen bits in the first polar code block and polar decode the first polar code block. This process may be repeated until either the first polar code block is correctly decoded or the first polar code block is considered lost (e.g., no additional retransmissions are available).

The HARQ circuit 343 in the receiving device may be further configured to identify the correct type of HARQ processing utilized by the transmitting device in generating the second polar code block based on the code rate of the first polar code block. In some examples, the receiving device may maintain a table 315 within, for example, memory 305 that includes a list of code rates and corresponding HARQ types (e.g., HARQ-IR or HARQ-CC). The HARQ circuit 343 may access the table 315 to identify a selected HARQ type corresponding to the code rate of the first polar code block and instruct the polar decoder 342 to perform decoding of the first and second polar code blocks utilizing the selected HARQ type. The code rate of the first polar code block may be signaled, for example, within control signaling from the transmitting device to the receiving device. In some examples, the code rate may be set by the base station (eNB) and signaled within downlink control signaling to the UE.

In lieu of the table 315, in some examples, the receiving device may maintain the code rate threshold 318 within, for example, memory 305. The HARQ circuit 343 may compare the code rate of the first polar code block to the code rate threshold 318 and select one of HARQ-CC or HARQ-IR based on the comparison. For example, the HARQ circuit 343 may select HARQ-IR if the code rate of the first polar code block is greater than the code rate threshold 318 and may select HARQ-CC if the code rate of the first polar code block is not greater than the code rate threshold 318. The HARQ circuit 343 may further select HARQ-CC if the code rate of the first polar code block is equal to the code rate threshold. The HARQ circuit 343 may then instruct the polar decoder 342 to decode the first and second polar code blocks using the selected HARQ type.

One or more processors 304 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 306. The computer-readable medium 306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 306 may reside in the processing system 314, external to the processing system 314, or distributed across multiple entities including the processing system 314. The computer-readable medium 306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Figure 4:
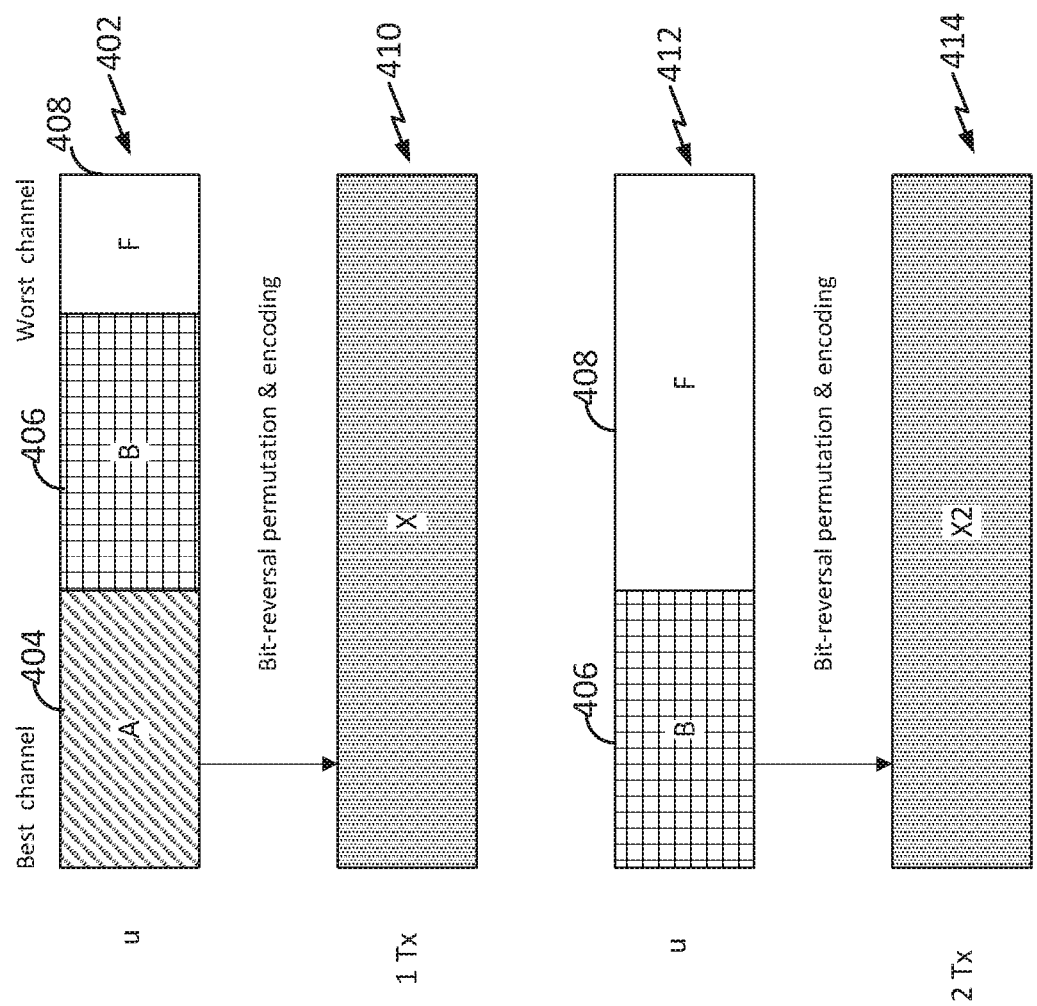
FIG. 4 is a schematic illustration of a hybrid automatic repeat request (HARQ) algorithm utilizing incremental redundancy (HARQ-IR) according to some embodiments.

FIG. 4 is a schematic illustration showing certain aspects of a HARQ-IR algorithm as it may be implemented according to some aspects of the present disclosure. Here, for ease of description, only a first transmission (1 Tx) and a single retransmission (2 Tx) are illustrated, although it is to be understood that any number of retransmissions may be employed.

In the U domain of the first transmission (i.e., the domain of the information bits in the original information block 402), the information bits are allocated into two sub-blocks 404 and 406, denoted as A and B. The original information block 402 further includes a frozen block 408 (labeled F) that contains frozen bits, each having a value of zero. The original information block 402 may have a length N, such that the bits in the sub-blocks 404 and 406 are information bits that correspond to the K good sub-channels, and the bits in the frozen block 408 are frozen bits that correspond to the N-K bad sub-channels, and are thus each fixed with a value of zero. In addition, the information bits in the A sub-block 404 may correspond to the M best sub-channels, whereas the information bits in the B sub-block 406 may correspond to the K-M worst sub-channels.

After bit-reversal permutation and encoding in accordance with a polar coding algorithm, a first polar code block 410 in the X domain (i.e., the domain of coded bits) is obtained. The first polar code block 410 may then be transmitted to a receiving device in a first transmission (1 Tx).

If the first transmission is decoded correctly by the receiving device, the transmission ends. However, if the first transmission is not decoded correctly (resulting in a NACK being transmitted from the receiving device), a retransmitted information block 412 with the information bits from the sub-block 406, denoted B, may be generated and transmitted. That is, the information bits in the B sub-block 406, along with the frozen bits in the F block 408, which now includes the bits from the non-selected sub-block 404 set as frozen bits, may be subject to bit reversal permutation and encoding according to a polar coding algorithm to generate a second polar code block 414, denoted X2. In the example shown in FIG. 4, the information bits in the B sub-block 406 have been mapped to the bit locations in the retransmitted information block 410 corresponding to the M best sub-channels, while the remaining bits have been set as frozen bits.

If the second transmission with the B sub-block 406 is not decoded correctly, the transmitting device may transmit a third transmission. This may continue until the limit of the number of retransmissions is reached, after which the transmission may terminate.

However, if the B sub-block in second transmission is decoded correctly, the B sub-block 406 in the first transmission 410 may be set as frozen bits, and the A sub-block 404 in the first transmission 410 may be decoded accordingly. In this case, it is equivalent to obtaining a low code rate for the A sub-block 404 in the first transmission. Thus, although polar coding is utilized, this example is equivalent to a conventional HARQ-IR scheme in terms of coding gain.

Figure 5:
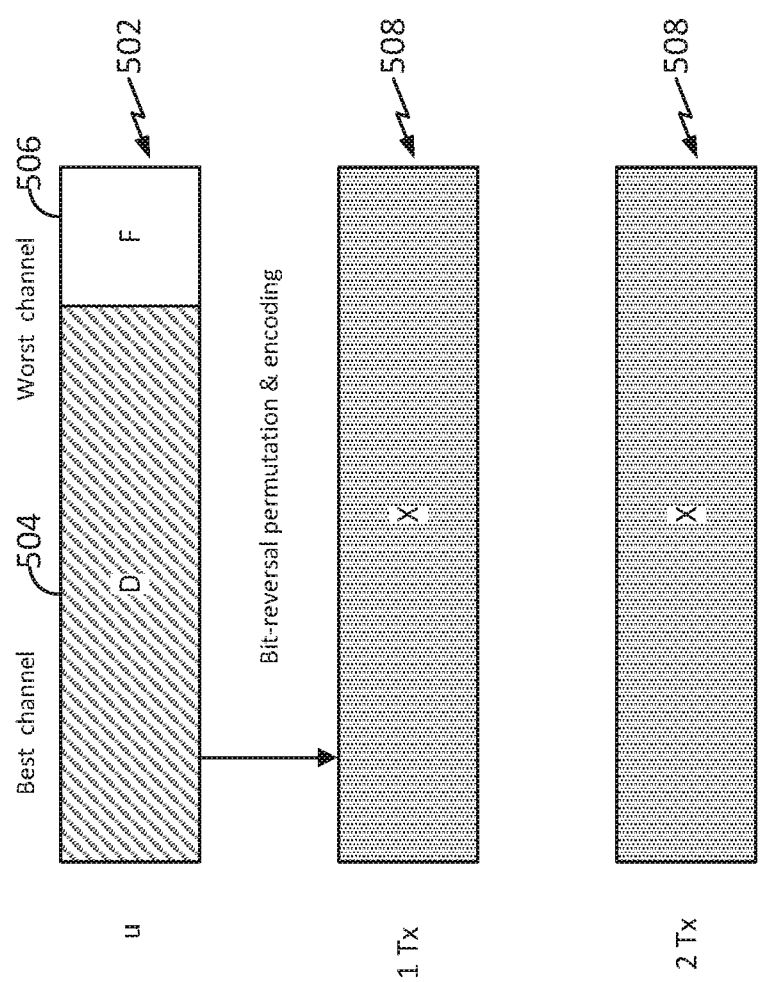
FIG. 5 is a schematic illustration of a HARQ algorithm utilizing chase combining (HARQ-CC) according to some embodiments.

FIG. 5 is a schematic illustration showing certain aspects of a HARQ-CC algorithm as it may be implemented according to some aspects of the present disclosure. Here, for ease of description, only a first transmission (1 Tx) and a single retransmission (2 Tx) are illustrated, although it is to be understood that any number of retransmissions may be employed.

In the U domain of the first transmission, labeled U, the information bits within the original information block 502 are located in block 504, denoted D. The original information block 402 further includes a frozen block 506 (labeled F) that contains frozen bits, each having a value of zero. The original information block 502 may have a length N, such that the bits in the blocks 504 are information bits that correspond to the K good sub-channels, and the bits in the frozen block 506 are frozen bits that correspond to the N-K bad sub-channels, and are thus each fixed with a value of zero. After bit-reversal permutation and encoding in accordance with a polar coding algorithm, a first polar code block 508 in X domain is obtained. The first polar code block 508 may then be transmitted to a receiving device in a first transmission (1 Tx).

If the first transmission is not decoded correctly (resulting in a NACK being transmitted from the receiving device), then the same polar code block 508 in the X domain may be transmitted once again (2 Tx) as a second polar code block.

Figure 6:
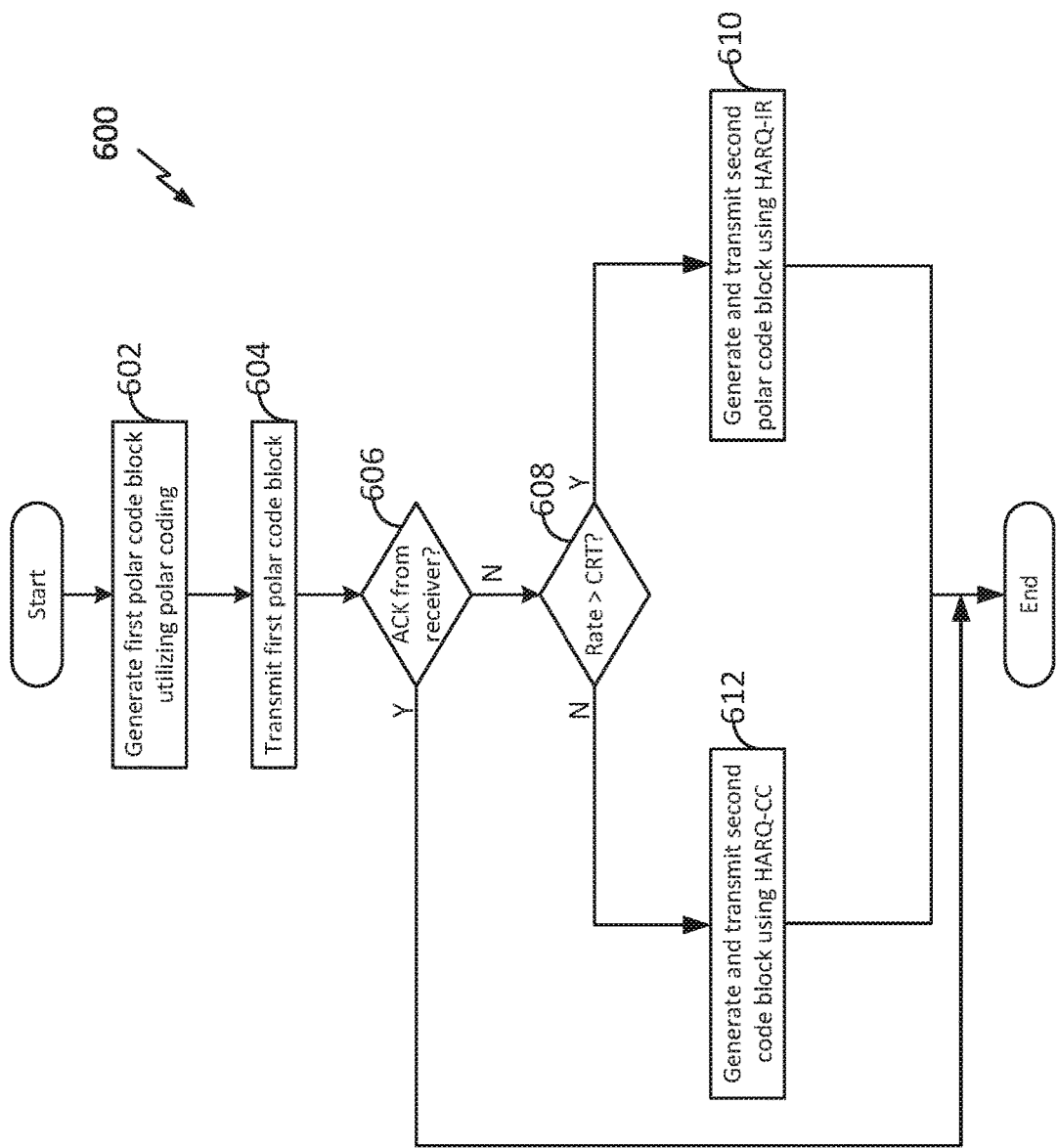
FIG. 6 is a flow chart illustrating an example of a process of wireless communication utilizing HARQ with polar coded transmissions according to some embodiments.

FIG. 6 is a flow chart illustrating an exemplary process 600 for wireless communication according to some aspects of the present disclosure. In some examples, the process 600 may be implemented by a wireless communication device 202, 204, or 300 as described above and illustrated in FIGS. 2 and 3. In some examples, the process 600 may be implemented by any suitable means for carrying out the described functions.

In various examples, the process 600 may be performed by a transmitting device, e.g., the wireless communication device 202. The process 600 may be implemented when the transmitting device 202 is a user equipment (UE), e.g., for uplink communication; and the process 600 may be implemented when the transmitting device is a base station, e.g., for downlink communication.

At block 602, the wireless communication device may generate a first polar code block utilizing polar coding. When generating the first polar code block, a suitable code rate R may be selected according to any of a number of parameters, such as a bit error rate, a block error rate, channel conditions, or other suitable parameters. At block 604, the wireless communication device may transmit the first polar code block to a receiving device. For example, the polar encoder 341 in cooperation with the transceiver 310 shown and described above in connection with FIG. 3 may generate and transmit the first polar code block to the receiver.

At block 606, the wireless communication device determines whether an ACK or NACK has been received from the receiving device, indicating whether the receiving device was able to properly decode the first polar code block. If the wireless communication device receives an ACK (Y branch of 606), the process may end, as a retransmission may not be required. However, if no ACK is received (e.g., if a NACK is received or if no HARQ feedback is received), the process may proceed along the N branch of 606 to block 608, where the wireless communication device determines whether the code rate of the first polar code block is greater than a given code rate threshold (e.g., ½). For example, the HARQ circuit 343 shown and described above in connection with FIG. 3 may determine whether an ACK is received, and if not, compare the code rate of the first polar code block with the code rate threshold.

If the code rate of the first polar code block is greater than the code rate threshold (Y branch of 608), at block 610, the wireless communication device may generate and transmit a second polar block code in accordance with a HARQ-IR procedure, as described above and illustrated in FIG. 4. That is, the second polar code block may differ from the first polar code block in the first transmission generated at block 602. However, if the code rate of the first polar code block is not greater than the given code rate threshold (N branch of 608), at block 612, the wireless communication device may generate and transmit a second polar code block in accordance with a HARQ-CC procedure, as described above and illustrated in FIG. 5. That is, the second polar code block may be the same as the first polar code block in the first transmission generated at block 602. For example, the HARQ circuit 343 in combination with the polar encoder 341 and transceiver 310 shown and described above in connection with FIG. 3 may generate and transmit the second polar code block utilizing either HARQ-IR or HARQ-CC.

Figure 7:
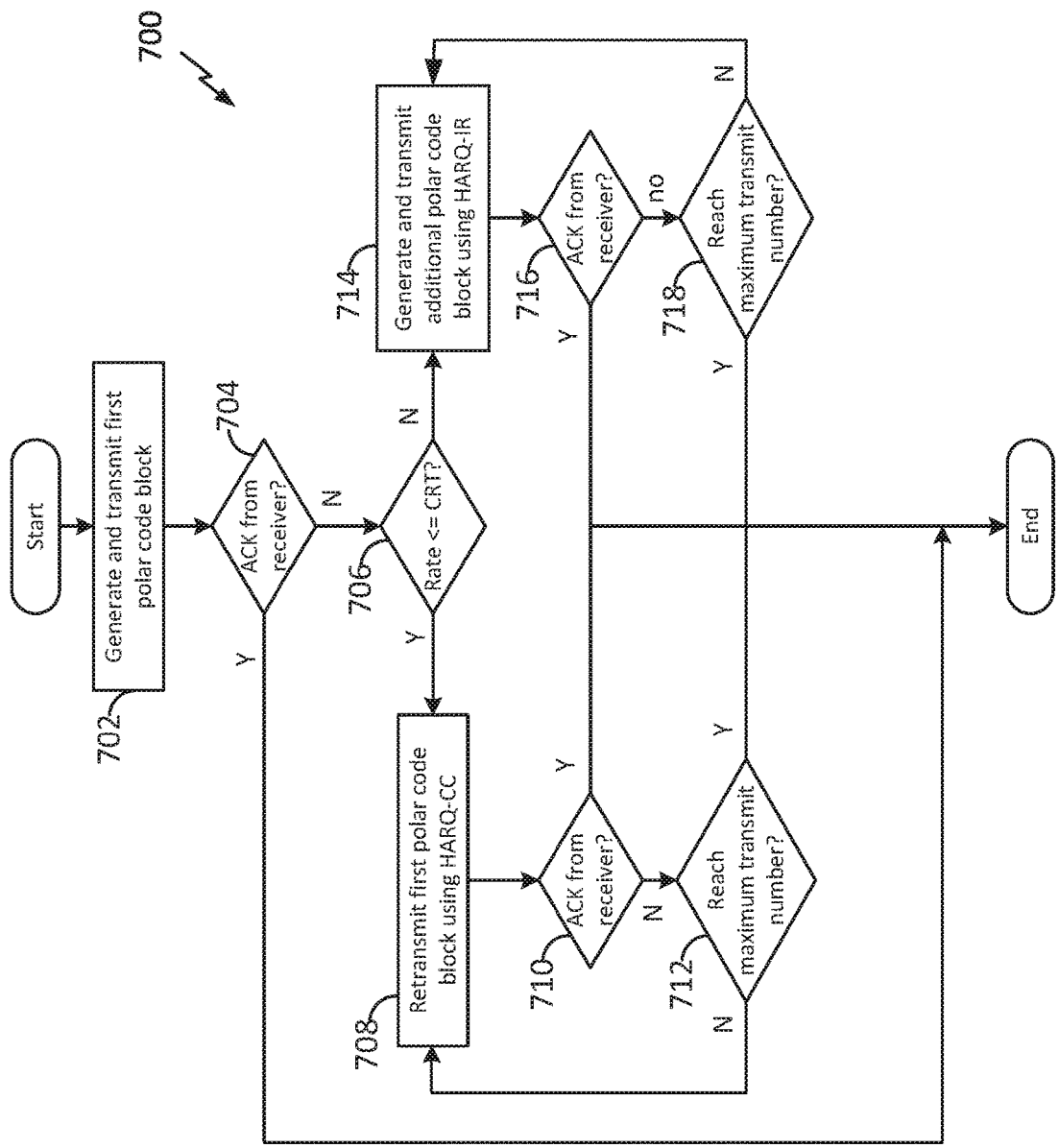
FIG. 7 is a flow chart illustrating another example of a process of wireless communication utilizing HARQ with polar coded transmissions according to some embodiments.

FIG. 7 is a flow chart illustrating an exemplary process 700 for wireless communication according to some aspects of the present disclosure. In some examples, the process 700 may be implemented by a wireless communication device 202, 204, or 300 as described above and illustrated in FIGS. 2 and 3. In some examples, the process 700 may be implemented by any suitable means for carrying out the described functions.

In various examples, the process 700 may be performed by a transmitting device, e.g., the wireless communication device 202. The process 700 may be implemented when the transmitting device 202 is a user equipment (UE), e.g., for uplink communication; and the process 700 may be implemented when the transmitting device is a base station, e.g., for downlink communication.

At block 702, the wireless communication device may generate a first polar code block utilizing polar coding and transmit the first polar code block to a receiving device. When generating the first polar code block, a suitable code rate R may be selected according to any of a number of parameters, such as a bit error rate, a block error rate, channel conditions, or other suitable parameters. For example, the polar encoder 341 in cooperation with the transceiver 310 shown and described above in connection with FIG. 3 may generate and transmit the first polar code block to the receiver.

At block 704, the wireless communication device determines whether an ACK or NACK has been received from the receiving device, indicating whether the receiving device was able to properly decode the first polar code block. If the wireless communication device receives an ACK (Y branch of 704), the process may end, as a retransmission may not be required. However, if no ACK is received (e.g., if a NACK is received or if no HARQ feedback is received), the process may proceed along the N branch of 704 to block 706, where the wireless communication device determines whether the code rate of the first polar code block is less than or equal to a given code rate threshold (e.g., ½). For example, the HARQ circuit 343 shown and described above in connection with FIG. 3 may determine whether an ACK is received, and if not, compare the code rate of the first polar code block with the code rate threshold.

If the code rate is less than or equal to the code rate threshold (Y branch of 706), at block 708, the wireless communication device may retransmit the first polar code block in accordance with a HARQ-CC procedure, as described above and illustrated in FIG. 5. That is, the retransmitted polar code block may be the same as the first polar code block in the first transmission generated at block 702. At block 710, the wireless communication device determines whether an ACK or NACK has been received from the receiving device, indicating whether the receiving device was able to properly decode the first polar code block.

If the wireless communication device receives an ACK (Y branch of 710), the process may end, as a retransmission may not be required. However, if no ACK is received (e.g., if a NACK is received or if no HARQ feedback is received), the process may proceed along the N branch of 710 to block 712, where the wireless communication determines whether the maximum number of retransmissions has been reached. If the maximum number of retransmissions has been reached (Y branch of 712), the process may end, as no additional retransmissions may be allowed. If the maximum number of retransmissions has not been reached (N branch of 712), the process returns to block 708, where the wireless communication device may retransmit the first polar code block in accordance with a HARQ-CC procedure.

This process, including blocks 708-712 may repeat a number of times if an ACK packet is not received from the receiving device, according to the maximum retransmission threshold utilized in a particular algorithm. After any HARQ retransmission, if an ACK is received from the receiving device, then the process may end. However, if no ACK is received after the maximum number of retransmissions is reached, then the process may end and the transmitting device may move on to the next information block to be transmitted.

Returning to block 706, if the code rate is not less than or equal to the code rate threshold (N branch of 706), then the process may proceed to block 714, where the wireless communication device 102 generate and transmit an additional polar code block in accordance with a HARQ-IR procedure, as described above and illustrated in FIG. 4. That is, the additional polar code block may differ from the first polar code block in the first transmission generated at block 702. At block 716, the wireless communication device determines whether an ACK or NACK has been received from the receiving device, indicating whether the receiving device was able to properly decode the first polar code block.

If the wireless communication device receives an ACK (Y branch of 716), the process may end, as a retransmission may not be required. However, if no ACK is received (e.g., if a NACK is received or if no HARQ feedback is received), the process may proceed along the N branch of 716 to block 718, where the wireless communication determines whether the maximum number of retransmissions has been reached. If the maximum number of retransmissions has been reached (Y branch of 718), the process may end, as no additional retransmissions may be allowed. If the maximum number of retransmissions has not been reached (N branch of 718), the process returns to block 714, where the wireless communication device may generate and transmit an additional polar code block in accordance with a HARQ-IR procedure.

This process, including blocks 714-718 may repeat a number of times if an ACK packet is not received from the receiving device, according to the maximum retransmission threshold utilized in a particular algorithm. After any HARQ retransmission, if an ACK is received from the receiving device, then the process may end. However, if no ACK is received after the maximum number of retransmissions is reached, then the process may end and the transmitting device may move on to the next information block to be transmitted. For example, the HARQ circuit 343 in combination with the polar encoder 341 and transceiver 310 shown and described above in connection with FIG. 3 may generate and transmit the second polar code block utilizing either HARQ-IR or HARQ-CC.

Figure 8:
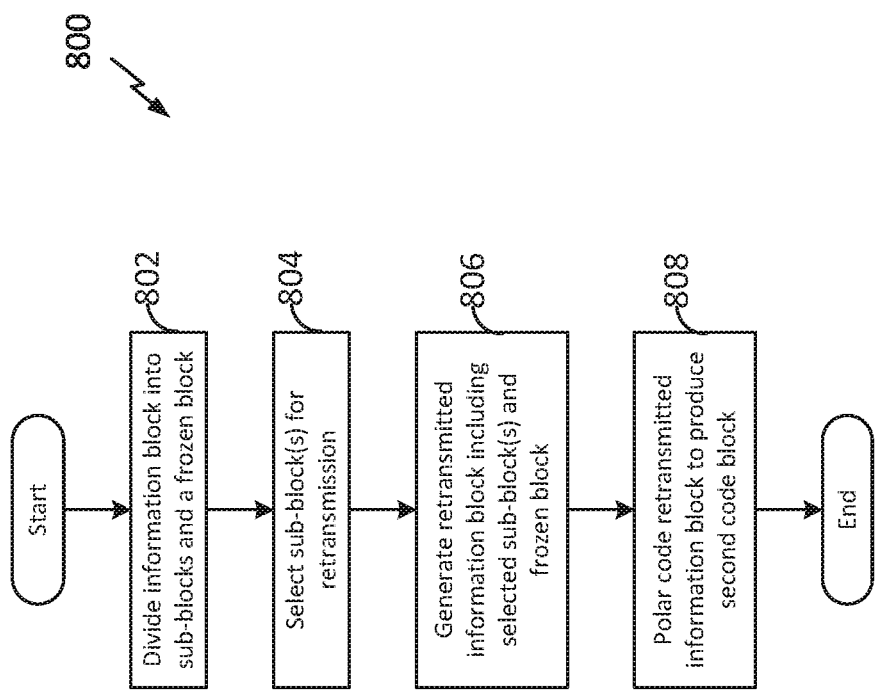
FIG. 8 is a flow chart illustrating an example of a process for performing HARQ-IR for polar coded transmissions according to some embodiments.

FIG. 8 is a flow chart illustrating an exemplary process 800 for performing HARQ-IR for polar coded transmissions according to some aspects of the present disclosure. In some examples, the process 800 may be implemented by a wireless communication device 202, 204, or 300 as described above and illustrated in FIGS. 2 and 3. In some examples, the process 800 may be implemented by any suitable means for carrying out the described functions.

In various examples, the process 800 may be performed by a transmitting device, e.g., the wireless communication device 202. The process 800 may be implemented when the transmitting device 202 is a user equipment (UE), e.g., for uplink communication; and the process 800 may be implemented when the transmitting device is a base station, e.g., for downlink communication. In some examples, the process 900 may be performed by the polar encoder 341 shown and described above in connection with FIG. 3.

At block 802, the wireless communication device may divide an original information block into two or more sub-blocks and a frozen block, where each of the sub-blocks includes information bits and the frozen block includes frozen bits, as described above. The wireless communication device may divide the original information block into the sub-blocks prior to polar coding the original information block or upon receiving a NACK or no response from the receiving device. At block 804, to perform HARQ-IR in response to receiving a NACK or no response from the receiving device, the wireless communication device may select one or more of the sub-blocks of the original information block for retransmission, where the number of selected sub-blocks is less than the total number of sub-blocks.

At block 806, the wireless communication device may then generate a retransmitted information block including the selected sub-block(s) of information bits and a frozen block including frozen bits. Here, the frozen block may include the original frozen block from the original information block and the non-selected sub-block from the original information block. Thus, the number of frozen bits in the retransmitted information block may be equal to the sum of the number of bits in the non-selected sub-block and the number of bits in the original frozen block. At block 808, the wireless communication device may polar code the retransmitted information block to produce a second polar code block for transmission to the receiving device.

Figure 9:
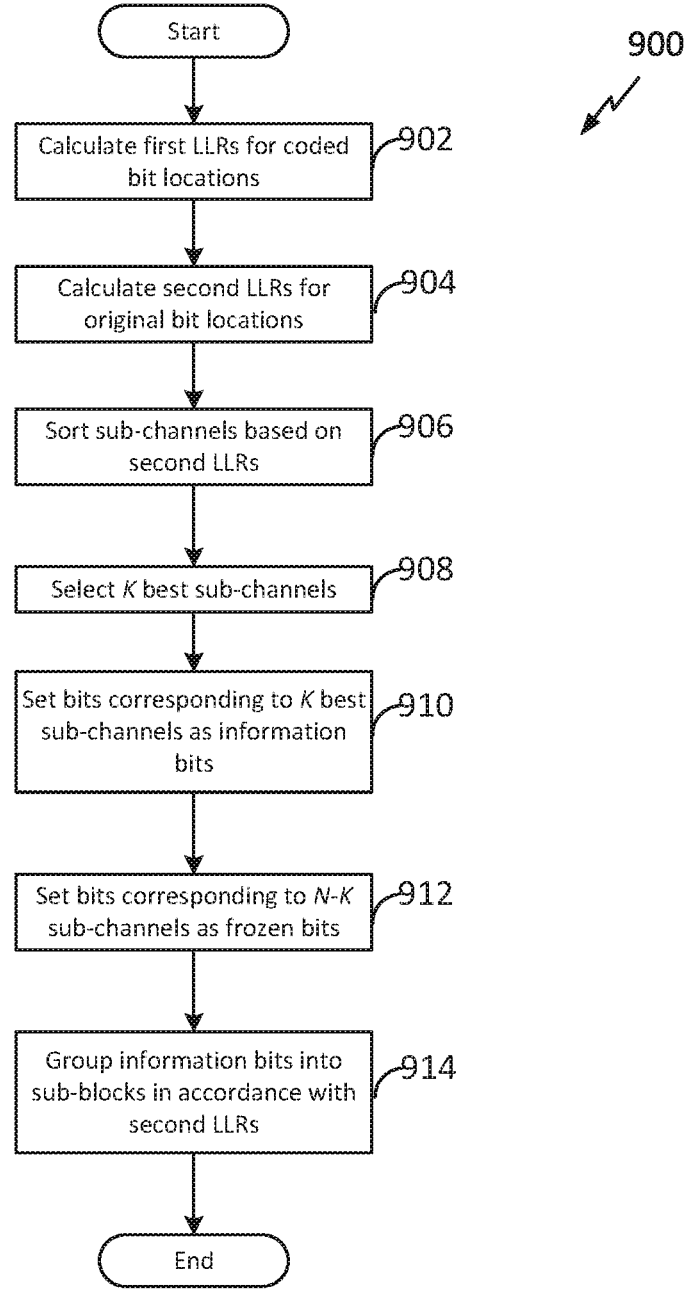
FIG. 9 is a flow chart illustrating another example of a process for performing HARQ-IR with polar coded transmissions according to some embodiments.

FIG. 9 is a flow chart illustrating an exemplary process 900 for performing HARQ-IR for polar coded transmissions according to some aspects of the present disclosure. In some examples, the process 900 may be implemented by a wireless communication device 202, 204, or 300 as described above and illustrated in FIGS. 2 and 3. In some examples, the process 900 may be implemented by any suitable means for carrying out the described functions.

In various examples, the process 900 may be performed by a transmitting device, e.g., the wireless communication device 202. The process 900 may be implemented when the transmitting device 202 is a user equipment (UE), e.g., for uplink communication; and the process 900 may be implemented when the transmitting device is a base station, e.g., for downlink communication. In some examples, the process 900 may be performed by the polar encoder 341 shown and described above in connection with FIG. 3.

At block 902, the wireless communication device may calculate a respective first log likelihood ratio (LLR) for each coded bit location associated with a first polar code block. In some examples, the first LLRs of the coded bit locations may be calculated from the sub-channel conditions (e.g., based on the respective SNRs of the sub-channels). At block 904, the wireless communication device may calculate a respective second LLR for each original bit location associated with an original information block. For example, since one or more of the original bits of the information block may contribute to each of the coded bits of the polar code block, the LLRs of each of the original bit locations may be derived from the known LLRs of the coded bit locations by performing density evolution or Gaussian approximation.

At block 906, based on the calculated original bit location LLRs (e.g., second LLRs), the wireless communication device may sort the sub-channels, and at block 908, select the K best sub-channels (e.g., "good" sub-channels) to transmit the information bits. At blocks 910 and 912, the wireless communication device may then set the original bit locations of the information block corresponding to the K best sub-channels as including information bits and the remaining original bit locations corresponding to the N-K sub-channels (e.g., "bad" sub-channels) as including frozen bits.

At block 914, the wireless communication device may then group the information bits into sub-blocks in accordance with the second LLRs. For example, the wireless communication device may group the information bits into sub-blocks in order of decreasing second LLRs (e.g., the first sub-block may include the information bits with the highest second LLRs, the second sub-block may include the information bits with the second highest LLRs, etc.).

Figure 10:
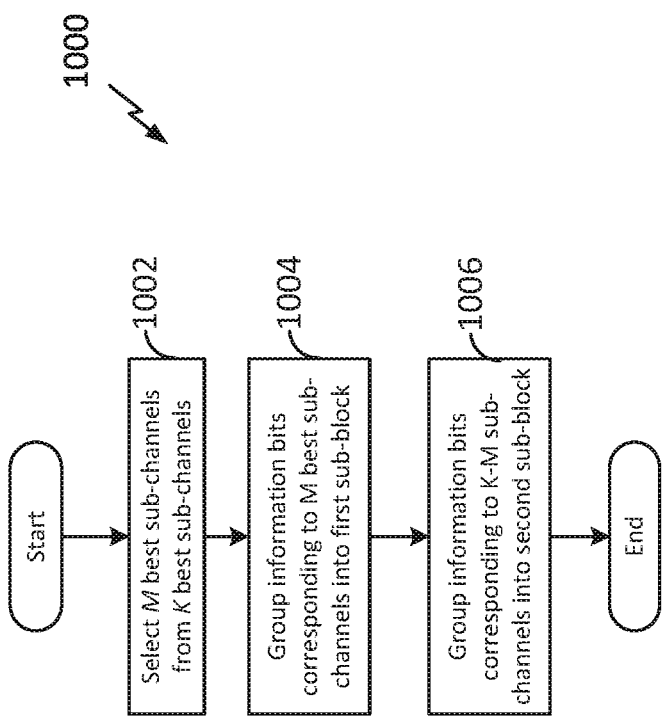
FIG. 10 is a flow chart illustrating another example of a process for performing HARQ-IR with polar coded transmissions according to some embodiments.

FIG. 10 is a flow chart illustrating an exemplary process 1000 for performing HARQ-IR for polar coded transmissions according to some aspects of the present disclosure. For example, the process 100 may be utilized to group the information bits into sub-blocks, as shown in block 914 of FIG. 9. In some examples, the process 1000 may be implemented by a wireless communication device 202, 204, or 300 as described above and illustrated in FIGS. 2 and 3. In some examples, the process 1000 may be implemented by any suitable means for carrying out the described functions.

In various examples, the process 1000 may be performed by a transmitting device, e.g., the wireless communication device 202. The process 1000 may be implemented when the transmitting device 202 is a user equipment (UE), e.g., for uplink communication; and the process 1000 may be implemented when the transmitting device is a base station, e.g., for downlink communication. In some examples, the process 900 may be performed by the polar encoder 341 shown and described above in connection with FIG. 3.

At block 1002, the wireless communication device may select the M best sub-channels from the K best sub-channels in accordance with the original bit location LLRs (e.g., second LLRs). At block 1004, the wireless communication device may group the information bits corresponding to the M best sub-channels (e.g., "best" sub-channels) into a first sub-block, and at block 1006, the information bits corresponding to the K-M sub-channels (e.g., "worst" sub-channels) into a second sub-block. In some examples, the wireless communication device may select the second sub-block for a HARQ-IR retransmission, as illustrated in FIG. 8.

Figure 11:
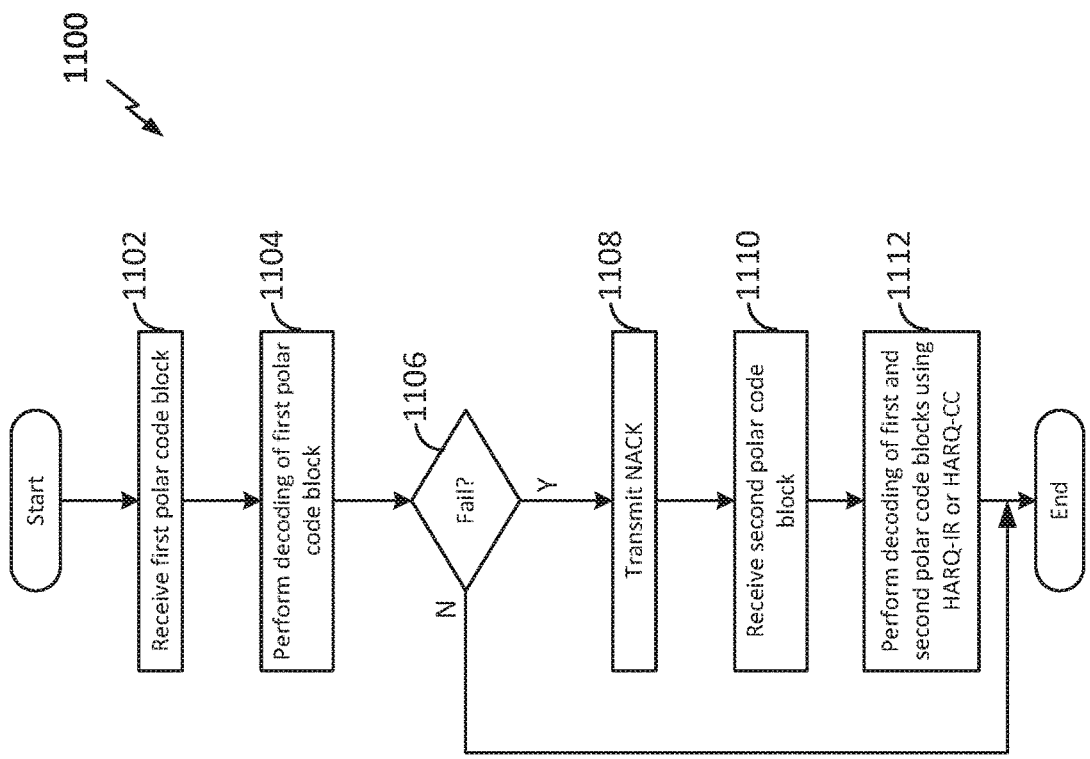
FIG. 11 is a flow chart illustrating another example of a process of wireless communication utilizing HARQ with polar coded transmissions according to some embodiments.

FIG. 11 is a flow chart illustrating an exemplary process 1100 for wireless communication according to some aspects of the present disclosure. In some examples, the process 1100 may be implemented by a wireless communication device 202, 204, or 300 as described above and illustrated in FIGS. 2 and 3. In some examples, the process 1100 may be implemented by any suitable means for carrying out the described functions.

In various examples, the process 1100 may be performed by a receiving device, e.g., the wireless communication device 204. The process 1100 may be implemented when the receiving device 204 is a user equipment (UE), e.g., for downlink communication; and the process 1100 may be implemented when the receiving device is a base station, e.g., for uplink communication.

At block 1102, the wireless communication device may receive a first polar code block generated using polar coding from a transmitting device. At block 1104, the wireless communication device may then perform polar decoding of the first polar code block, as described above. For example, the polar decoder 342 in combination with the transceiver 310 shown and described above in connection with FIG. 3 may receive the first polar code block and polar decode the first polar code block.

At block 1106, the wireless communication device may determine whether the polar decoding of the first polar code block failed. If polar decoding of the first polar code block did not fail (N branch of 1106), the process may end. For example, the polar decoder 342 and/or the HARQ circuit 343 shown and described above in connection with FIG. 3 may determine whether the polar decoding of the first polar code block failed.

However, if polar decoding of the first polar code block failed (Y branch of 1106), at block 1108, the wireless communication device may generate and transmit a NACK to the transmitting device. For example, the HARQ circuit 343 shown and described above in connection with FIG. 3 may generate and transmit the NACK to the transmitting device via the transceiver 310. In response to the NACK, at block 1110, the wireless communication device may receive a second polar code block generated using polar coding from the transmitting device. For example, the polar decoder 342 in combination with the transceiver 310 shown and described above in connection with FIG. 3 may receive the second polar code block.

At block 1112, the wireless communication device may then perform polar decoding of the first and second polar code blocks utilizing one of HARQ-IR or HARQ-CC based on the code rate of the first polar code block. In some examples, if the second polar code block is generated utilizing HARQ-CC (based on the code rate of the first polar code bock), the wireless communication device may perform soft combining of the first and second polar code blocks, in which the redundant bits from the second polar code block are combined with the corresponding bits in the first polar code block to increase the probability of correct reception of each information bit.

In some examples, if the second polar code block is generated utilizing HARQ-IR (based on the code rate of the first polar code block), the second polar code word may include one or more sub-blocks of information bits from the original information block. For example, the original information block may be divided into two or more sub-blocks, each including information bits, and a frozen block including frozen bits. The second polar code block may then be generated using a retransmitted information block including one or more selected sub-blocks of the two or more sub-blocks of the original information block and the frozen block, where the number of selected sub-block(s) is less than the total number of sub-blocks of the original information block. As described above, the frozen block may include the original frozen block from the original information block and the non-selected sub-block(s) from the original information block. For example, the HARQ circuit 343 in combination with the polar decoder 342 shown and described above in connection with FIG. 3 may polar decode the first and second polar code blocks utilizing HARQ-CC or HARQ-IR.

Figure 12:
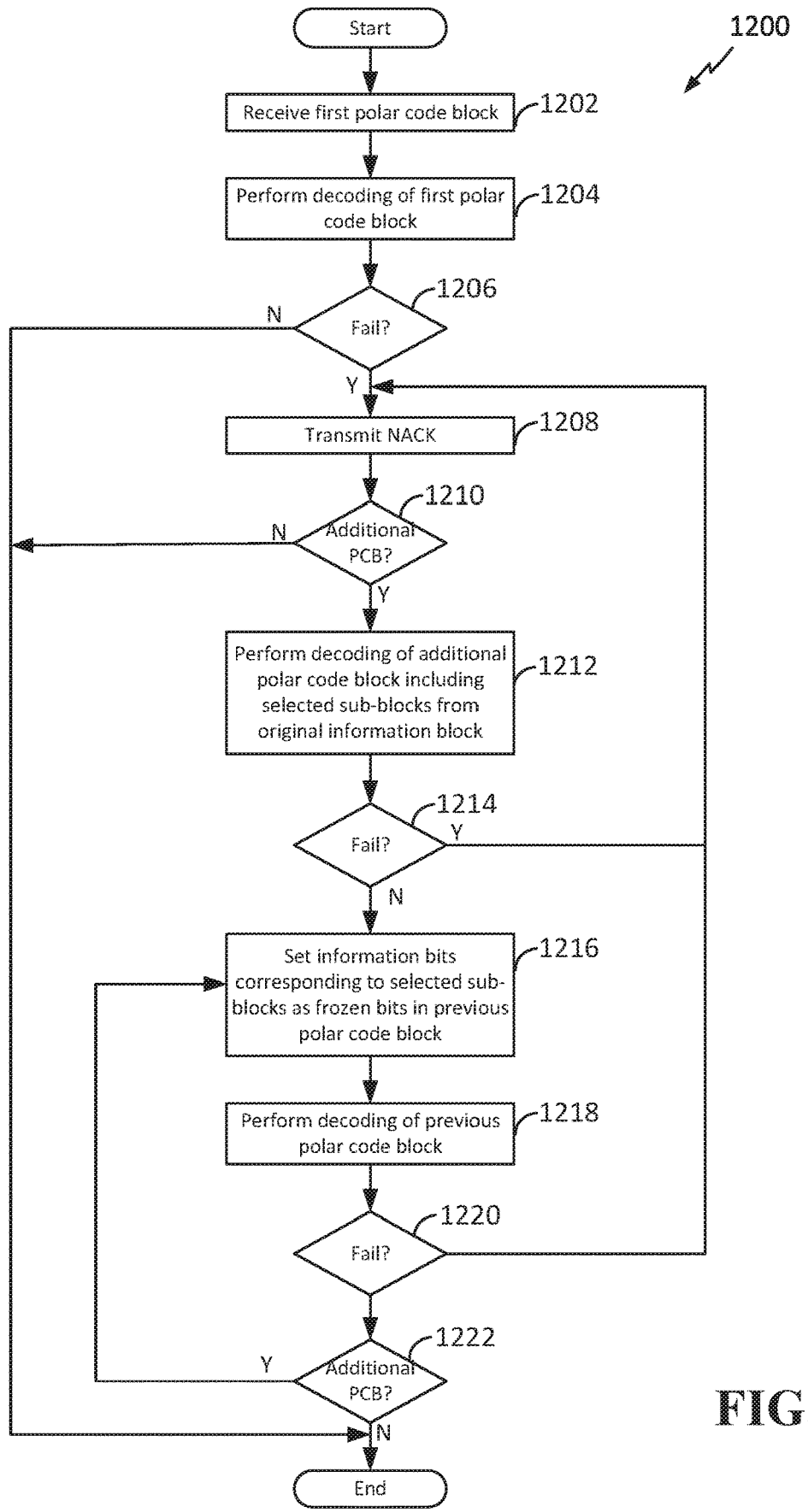
FIG. 12 is a flow chart illustrating another example of a process of for performing HARQ-IR with polar coded transmissions according to some embodiments.

FIG. 12 is a flow chart illustrating an exemplary process 1200 for performing HARQ-IR for polar coded transmissions according to some aspects of the present disclosure. In some examples, the process 1200 may be implemented by a wireless communication device 202, 204, or 300 as described above and illustrated in FIGS. 2 and 3. In some examples, the process 1200 may be implemented by any suitable means for carrying out the described functions.

In various examples, the process 1200 may be performed by a receiving device, e.g., the wireless communication device 204. The process 1200 may be implemented when the receiving device 204 is a user equipment (UE), e.g., for downlink communication; and the process 1200 may be implemented when the receiving device is a base station, e.g., for uplink communication.

At block 1202, the wireless communication device may receive a first polar code block generated using polar coding from a transmitting device. At block 1204, the wireless communication device may then perform polar decoding of the first polar code block, as described above. For example, the polar decoder 342 in combination with the transceiver 310 shown and described above in connection with FIG. 3 may receive the first polar code block and polar decode the first polar code block.

At block 1206, the wireless communication device may determine whether the polar decoding of the first polar code block failed. If polar decoding of the first polar code block did not fail (N branch of 1206), the process may end. For example, the polar decoder 342 and/or the HARQ circuit 343 shown and described above in connection with FIG. 3 may determine whether the polar decoding of the first polar code block failed.

However, if polar decoding of the first polar code block failed (Y branch of 1206), at block 1208, the wireless communication device may generate and transmit a NACK to the transmitting device. For example, the HARQ circuit 343 shown and described above in connection with FIG. 3 may generate and transmit the NACK to the transmitting device via the transceiver 310. In response to the NACK, at block 1210, the wireless communication device may determine whether an additional polar code block related to the first polar code block is received. For example, the HARQ circuit 343 and/or the polar decoder 342 shown and described above in connection with FIG. 3 may determine whether an additional polar code block was received. If an additional polar code block is not received (N branch of 1210), the process may end. For example, a maximum number of retransmissions may have been reached, and therefore, the polar code block may be considered lost.

However, if the wireless communication device receives an additional polar code block associated with the first polar code block that was generated using polar coding from the transmitting device (Y branch of 1210), at block 1212, the wireless communication device may perform polar decoding of the additional polar code block. In some examples, the additional polar code block may include one or more selected sub-blocks of information bits from the original information block, where the number of selected sub-blocks is less than the total number of sub-blocks in the original information block. For example, the polar decoder 342 shown and described above in connection with FIG. 3 may perform polar decoding of the additional polar code block. At block 1214, the wireless communication device may determine whether the polar decoding of the additional polar code block failed. For example, the polar decoder 342 and/or the HARQ circuit 343 shown and described above in connection with FIG. 3 may determine whether the polar decoding of the additional polar code block failed.

If polar decoding of the additional polar code block failed (Y branch of 1214), the process may return to block 1208, where the wireless communication device may transmit a NACK to the transmitting device. For example, the HARQ circuit 343 shown and described above in connection with FIG. 3 may generate and transmit the NACK to the transmitting device via the transceiver 310.

However, if polar decoding of the additional polar code block did not fail (N branch of 1214), at block 1216, the wireless communication device may then set the information bits corresponding to the selected sub-block(s) in the additional polar code block as frozen bits in the previous polar code block (e.g., the previous polar code block may be the first polar code block if the additional polar code block is the second polar code block received immediately after the first polar code block). At block 1218, the wireless communication device may then perform polar decoding of the previous polar code block. For example, the polar decoder 342 shown and described above in connection with FIG. 2 may polar decode the previous polar code block.

At block 1220, the wireless communication device may determine whether the polar decoding of the previous polar code block failed. For example, the polar decoder 342 and/or the HARQ circuit 343 shown and described above in connection with FIG. 3 may determine whether the polar decoding of the previous polar code block failed. If polar decoding of the previous polar code block failed (Y branch of 1220), the process may return to block 1208, where the wireless communication device may transmit a NACK to the transmitting device. For example, the HARQ circuit 343 shown and described above in connection with FIG. 3 may generate and transmit the NACK to the transmitting device via the transceiver 310.

However, if polar decoding of the previous polar code block did not fail (N branch of 1220), at block 1222, the wireless communication device may determine whether additional previous polar code blocks were received. If additional previous polar code blocks were not received (N branch of 1222), the process may end as the polar code block was successfully decoded. However, if additional previous polar code blocks were received (Y branch of 1222), the process may return to block 1216, where the wireless communication device may set the information bits corresponding to the selected sub-block(s) of the previous polar code block as frozen bits in the additional previous polar code block. For example, the polar decoder 342 shown and described above in connection with FIG. 3 may polar decode any previous polar code blocks, including the first polar code block. This process at blocks 1208-1222 may be repeated until either the first polar code block is correctly decoded or the first polar code block is considered lost (e.g., no additional retransmissions are available).

Figure 13:
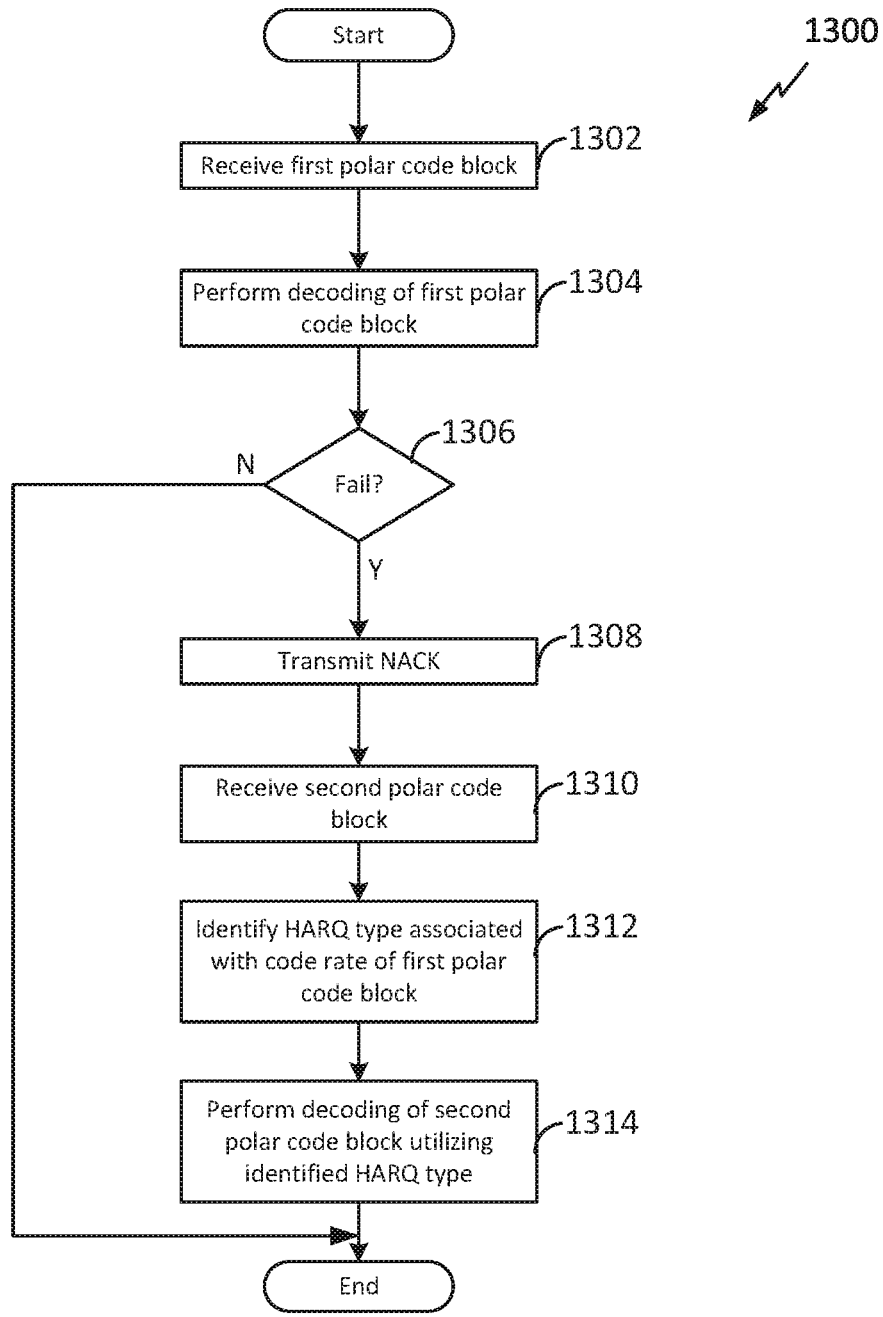
FIG. 13 is a flow chart illustrating another example of a process of wireless communication utilizing HARQ with polar coded transmissions according to some embodiments.

FIG. 13 is a flow chart illustrating an exemplary process 1300 for wireless communication according to some aspects of the present disclosure. In some examples, the process 1300 may be implemented by a wireless communication device 202, 204, or 300 as described above and illustrated in FIGS. 2 and 3. In some examples, the process 1300 may be implemented by any suitable means for carrying out the described functions.

In various examples, the process 1300 may be performed by a receiving device, e.g., the wireless communication device 204. The process 1300 may be implemented when the receiving device 204 is a user equipment (UE), e.g., for downlink communication; and the process 1300 may be implemented when the receiving device is a base station, e.g., for uplink communication.

At block 1302, the wireless communication device may receive a first polar code block generated using polar coding from a transmitting device. At block 1304, the wireless communication device may then perform polar decoding of the first polar code block, as described above. For example, the polar decoder 342 in combination with the transceiver 310 shown and described above in connection with FIG. 3 may receive the first polar code block and polar decode the first polar code block.

At block 1306, the wireless communication device may determine whether the polar decoding of the first polar code block failed. If polar decoding of the first polar code block did not fail (N branch of 1306), the process may end. For example, the polar decoder 342 and/or the HARQ circuit 343 shown and described above in connection with FIG. 3 may determine whether the polar decoding of the first polar code block failed.

However, if polar decoding of the first polar code block failed (Y branch of 1306), at block 1308, the wireless communication device may generate and transmit a NACK to the transmitting device. For example, the HARQ circuit 343 shown and described above in connection with FIG. 3 may generate and transmit the NACK to the transmitting device via the transceiver 310. In response to the NACK, at block 1310, the wireless communication device may receive a second polar code block generated using polar coding from the transmitting device.

At block 1312, the wireless communication device may then identify a HARQ type (e.g., a HARQ algorithm) associated with the code rate of the first polar code block. In some examples, the wireless communication device may access a table containing a list of code rates and corresponding HARQ types (e.g., HARQ-IR or HARQ-CC) and identify a selected HARQ type corresponding to the code rate of the first polar code block. In other examples, the wireless communication device may compare the code rate of the first polar code block to a code rate threshold maintained by the wireless communication device or transmitted to the wireless communication device by the transmitting device. If the code rate of the first polar code block is greater than the code rate threshold, the wireless communication device may select the HARQ-IR type (e.g., a HARQ-IR algorithm), whereas if the code rate of the first polar code block is not greater than the code rate threshold, the wireless communication device may select the HARQ-CC type (e.g., a HARQ-CC algorithm). For example, the HARQ circuit 343 shown and described above in connection with FIG. 3 may identify the HARQ type.

At block 1314, the wireless communication device may then perform polar decoding of the first and second polar code blocks utilizing the selected HARQ type. For example, the polar decoder 342 shown and described above in connection with FIG. 3 may perform polar decoding of the first and second polar code blocks.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-13 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-3 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication utilizing hybrid automatic repeat request (HARQ), the method comprising:
    dividing an original information block into two sub-blocks and a frozen block, wherein each of the two sub-blocks comprises information bits and the frozen block comprises frozen bits;
    polar coding the original information block to produce a first polar code block;
    transmitting the first polar code block;
    receiving a negative acknowledgment (NACK) or no response, in response to the first polar code block;
    if a code rate of the first polar code block is greater than a code rate threshold, generating and transmitting a second polar code block utilizing incremental redundancy HARQ (HARQ-IR) by:
        selecting one of the two sub-blocks of the original information block as a selected sub-block for retransmission;
        generating a retransmitted information block consisting of only the selected sub-block and the frozen block; and
        polar coding the retransmitted information block to produce the second polar code block; and
    if the code rate of the first polar code block is less than the code rate threshold, generating and transmitting the second polar code block utilizing chase combining HARQ (HARQ-CC).

2. The method of claim 1, wherein the original information block comprises a plurality of original bit locations and the first polar code block comprises a plurality of coded bit locations, each of the plurality of coded bit locations corresponding to one of a plurality of N sub-channels over which the first polar code block is transmitted, and wherein generating the first polar code block further comprises:
    calculating respective first log likelihood ratios (LLRs) for each of the plurality of coded bit locations;

calculating respective second LLRs for each of the plurality of original bit locations from the respective first LLRs;
sorting the plurality of sub-channels based on the second LLRs;
selecting K best sub-channels in accordance with the second LLRs;
setting first original bits of the original information block corresponding to the K best sub-channels as the information bits;
setting second original bits of the information block corresponding to N-K sub-channels as the frozen bits comprising the frozen block; and
grouping the information bits into the two sub-blocks in accordance with the second LLRs.

3. The method of claim 2, wherein grouping the information bits into the two sub-blocks further comprises:
selecting M best sub-channels from the K best sub-channels in accordance with the second LLRs;
grouping the information bits corresponding to the M best sub-channels into a first sub-block of the two sub-blocks; and
grouping the information bits corresponding to K-M sub-channels into a second sub-block of the two sub-blocks.

4. The method of claim 3, wherein selecting one of the two sub-blocks of the original information block as the selected sub-block for retransmission further comprises:
selecting the second sub-block of the two sub-blocks as the selected sub-block.

5. The method of claim 1, further comprising:
if the code rate of the first polar code block is equal to the code rate threshold, generating and transmitting the second polar code block utilizing one of HARQ-IR or HARQ-CC.

6. The method of claim 5, wherein generating and transmitting the second polar code block utilizing one of HARQ-IR or HARQ-CC further comprises:
if the code rate of the first polar code block is equal to the code rate threshold, generating and transmitting the second polar code block utilizing HARQ-CC when a respective performance of HARQ-IR and HARQ-CC at the code rate is equal.

7. The method of claim 1, wherein the second polar code block is identical to the first polar code block when HARQ-CC is utilized.

8. A wireless communication device configured for utilizing hybrid automatic repeat request (HARQ), the wireless communication device comprising:
a transceiver;
a memory; and
a processor communicatively coupled to the transceiver and the memory, wherein the processor is configured to:
divide an original information block into two sub-blocks and a frozen block, wherein each of the two sub-blocks comprises information bits and the frozen block comprises frozen bits;
polar coding the original information block to produce a first polar code block;
transmit the first polar code block via the transceiver;
receive a negative acknowledgment (NACK) or no response via the transceiver, in response to the first polar code block;
if a code rate of the first polar code block is greater than a code rate threshold, generate and transmit a second polar code block utilizing incremental redundancy HARQ (HARQ-IR) by:
selecting one of the two sub-blocks of the original information block as a selected sub-block for retransmission;
generating a retransmitted information block consisting of only the selected sub-block and the frozen block; and
polar coding the retransmitted information block to produce the second polar code block; and
if the code rate of the first polar code block is less than the code rate threshold, generate and transmit the second polar code block utilizing chase combining HARQ (HARQ-CC).

9. The wireless communication device of claim 8, wherein the original information block comprises a plurality of original bit locations and the first polar code block comprises a plurality of coded bit locations, each of the plurality of coded bit locations corresponding to one of a plurality of N sub-channels over which the first polar code block is transmitted, and wherein the processor is further configured to:
calculate respective first log likelihood ratios (LLRs) for each of the plurality of coded bit locations;
calculate respective second LLRs for each of the plurality of original bit locations from the respective first LLRs;
sort the plurality of sub-channels based on the second LLRs;
select K best sub-channels in accordance with the second LLRs;
set first original bits of the original information block corresponding to the K best sub-channels as the information bits;
set second original bits of the information block corresponding to N-K sub-channels as the frozen bits comprising the frozen block; and
group the information bits into the two sub-blocks in accordance with the second LLRs.

10. The wireless communication device of claim 9, wherein the processor is further configured to:
select M best sub-channels from the K best sub-channels in accordance with the second LLRs;
group the information bits corresponding to the M best sub-channels into a first sub-block of the two sub-blocks; and
group the information bits corresponding to K-M sub-channels into a second sub-block of the two sub-blocks.

11. The wireless communication device of claim 10, wherein the processor is further configured to:
select the second sub-block of the two sub-blocks as the selected sub-block.

12. The wireless communication device of claim 8, wherein the processor is further configured to:
if the code rate of the first polar code block is equal to the code rate threshold, generate and transmit the second polar code block utilizing one of HARQ-IR or HARQ-CC.

13. The wireless communication device of claim 12, wherein the processor is further configured to:
if the code rate of the first polar code block is equal to the code rate threshold, generate and transmit the second polar code block utilizing HARQ-CC when a respective performance of HARQ-IR and HARQ-CC at the code rate is equal.

14. A method of wireless communication utilizing hybrid automatic repeat request (HARQ), the method comprising:
receiving a first polar code block generated by polar coding an original information block, the original information block comprising two sub-blocks and a frozen block, wherein each of the two sub-blocks comprises information bits and the frozen block comprises frozen bits;
perform decoding of the first polar code block;
if decoding of the first polar code block fails, transmitting a negative acknowledgment (NACK);
receiving a second polar code block generated utilizing polar coding in response to the NACK; and
perform decoding of the second polar code block and the first polar code block utilizing one of incremental redundancy HARQ (HARQ-IR) or chase combining HARQ (HARQ-CC) based on a code rate of the first polar code block;
wherein if the second code block is generated utilizing HARQ-IR, the second polar code block is generated by polar coding a retransmitted information block, the retransmitted information block consisting of only a selected sub-block of the two sub-blocks and the frozen block.

15. The method of claim 14, wherein decoding the second polar code block and the first polar code block utilizing HARQ-IR further comprises:
perform decoding of the second polar code block;
setting the information bits corresponding to the selected sub-block as frozen bits in the first polar code block; and
perform decoding of the first polar code block.

16. The method of claim 14, wherein decoding the second polar code block and the first polar code block utilizing one of HARQ-IR or HARQ-CC further comprises:
accessing a table comprising a list of code rates and corresponding HARQ types, wherein each of the HARQ types comprises HARQ-IR or HARQ-CC;
identifying a selected HARQ type corresponding to the code rate of the first polar code block; and
perform decoding of the second polar code block and the first polar code block utilizing the selected HARQ type.

17. The method of claim 14, wherein decoding the second polar code block and the first polar code block utilizing one of HARQ-IR or HARQ-CC further comprises:
comparing the code rate of the first polar code block to a code rate threshold;
if the code rate of the first polar code block is greater than the code rate threshold, decoding the second polar code block and the first polar code block utilizing HARQ-IR; and
if the code rate of the first polar code block is not greater than the code rate threshold, decoding the second polar code block and the first polar code block utilizing HARQ-CC.

18. A wireless communication device configured for utilizing hybrid automatic repeat request (HARQ), the wireless communication device comprising:
a transceiver;
a memory; and
a processor communicatively coupled to the transceiver and the memory, wherein the processor is configured to:
receive a first polar code block generated by polar coding an original information block, the original information block comprising two sub-blocks and a frozen block, wherein each of the two sub-blocks comprises information bits and the frozen block comprises frozen bits;
perform decoding of the first polar code block;
if decoding of the first polar code block fails, transmit a negative acknowledgment (NACK) via the transceiver;
receive a second polar code block generated utilizing polar coding in response to the NACK via the transceiver; and
perform decoding of the second polar code block and the first polar code block utilizing one of incremental redundancy HARQ (HARQ-IR) or chase combining HARQ (HARQ-CC) based on a code rate of the first polar code block;
wherein if the second code block is generated utilizing HARQ-IR, the second polar code block is generated by polar coding a retransmitted information block, the retransmitted information block consisting of only a selected sub-block of the two sub-blocks and the frozen block.

19. The wireless communication device of claim 18, wherein the processor is further configured to:
utilize HARQ-IR to:
perform decoding of the second polar code block;
set the information bits corresponding to the selected sub-block as frozen bits in the first polar code block; and
perform decoding of the first polar code block.

20. The wireless communication device of claim 18, wherein the processor is further configured to:
access a table comprising a list of code rates and corresponding HARQ types, wherein each of the HARQ types comprises HARQ-IR or HARQ-CC;
identify a selected HARQ type corresponding to the code rate of the first polar code; and
perform decoding of the second code block and the first polar code block utilizing the selected HARQ type.

21. The wireless communication device of claim 18, wherein the processor is further configured to:
compare the code rate of the first polar code block to a code rate threshold;
if the code rate of the first polar code block is greater than the code rate threshold, decode the second polar code block and the first polar code block utilizing HARQ-IR; and
if the code rate of the first polar code block is not greater than the code rate threshold, decode the second polar code block and the first polar code block utilizing HARQ-CC.

* * * * *